United States Patent [19]
Ueda et al.

[11] Patent Number: 5,874,869
[45] Date of Patent: Feb. 23, 1999

[54] SURFACE ACOUSTIC WAVE FILTER DEVICE ON 40° TO 42° ROTATED Y-X LITAO$_3$

[75] Inventors: Masanori Ueda; Osamu Kawachi; Gou Endoh; Yoshiro Fujiwara, all of Kawasaki, Japan

[73] Assignee: Fujitsu Limited, Kanagawa, Japan

[21] Appl. No.: 925,732

[22] Filed: Sep. 9, 1997

[30] Foreign Application Priority Data

Nov. 28, 1996 [JP] Japan .................................. 8-318270

[51] Int. Cl.$^6$ ...................................................... H03H 9/64
[52] U.S. Cl. ..................... 333/193; 333/195; 310/313 A; 310/313 D
[58] Field of Search ..................... 333/193–196; 310/313 B, 313 R, 313 C, 313 D, 313 A

[56] References Cited

U.S. PATENT DOCUMENTS

| 5,485,052 | 1/1996 | Seki et al. ................. 310/313 A X |
| 5,592,135 | 1/1997 | Taguchi et al. ..................... 333/193 |
| 5,717,367 | 2/1998 | Murai .......................... 333/193 X |

FOREIGN PATENT DOCUMENTS

| 1-231417 | 9/1989 | Japan ..................................... 333/193 |
| 6-164306 | 6/1994 | Japan ................................. 310/313 A |
| 6-188673 | 7/1994 | Japan ..................................... 333/193 |
| 7-15274 | 1/1995 | Japan ..................................... 333/193 |
| 7-58581 | 3/1995 | Japan ..................................... 333/193 |

*Primary Examiner*—Robert Pascal
*Assistant Examiner*—Barbara Summons
*Attorney, Agent, or Firm*—Armstrong, Westerman, Hattori, McLeland & Naughton

[57] ABSTRACT

A surface acoustic wave device includes a piezoelectric substrate of a LiTaO$_3$ single crystal, the crystal having X, Y and Z axes and a cut plane. The X axis of the crystal is oriented in a direction of propagation of surface acoustic waves. The cut plane of the crystal is rotated around the X axis at a rotated angle from the Y axis to the Z axis, the rotated angle being in a range between 40° and 42°. A pair of reflectors are formed on the substrate and aligned in a row in the direction of propagation. Interdigital transducers are formed on the substrate and aligned in the row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer aligned in the row in the direction of propagation. In the device, a ratio of the number of pairs of the electrode fingers in one of the front transducer and the rear transducer to the number of pairs of the electrode fingers in the middle transducer is in a range between 55% and 80%.

19 Claims, 20 Drawing Sheets

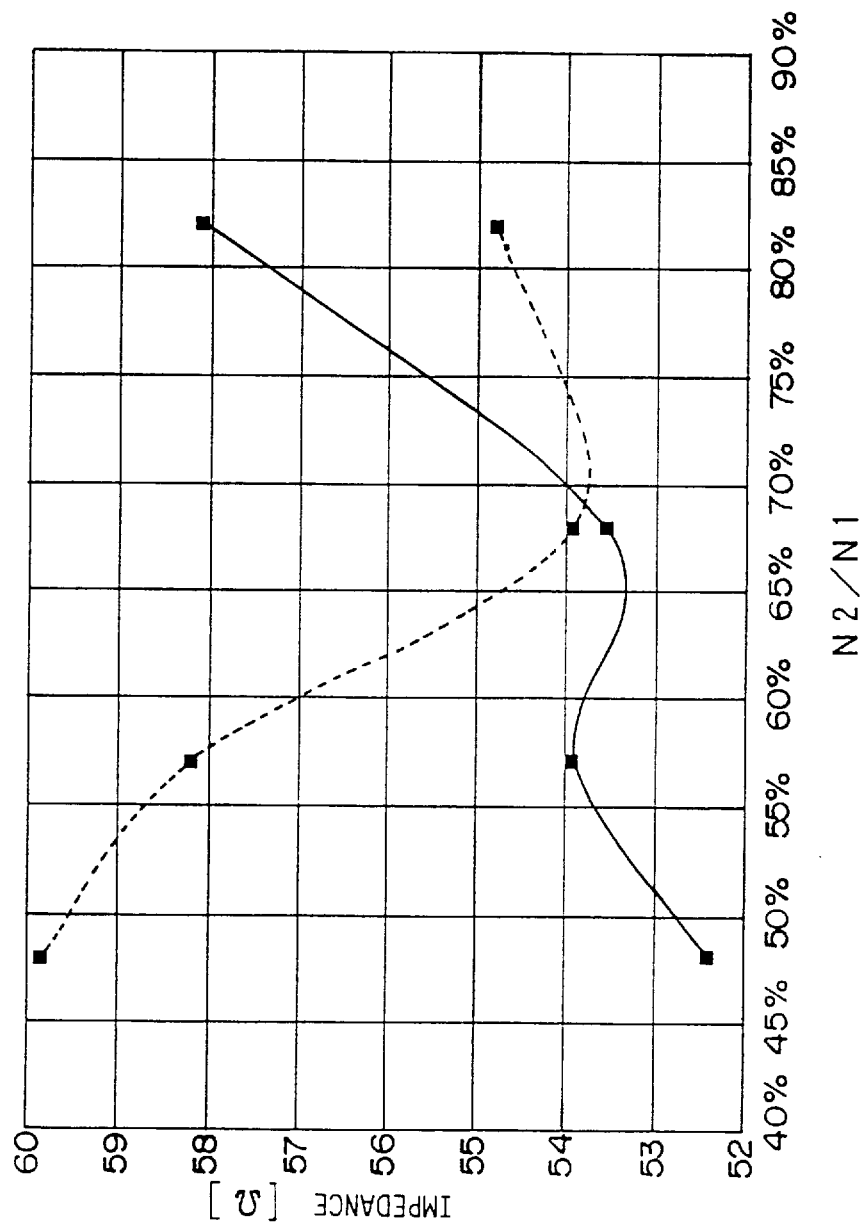

SURFACE ACOUSTIC WAVE FILTER DEVICE ON 40° TO 42° ROTATED Y-X LITAO₃

BACKGROUND OF THE INVENTION

(1) Field of the Invention

The present invention generally relates to a surface acoustic wave device, and more particularly to a surface acoustic wave device which is appropriate to provide good passband characteristics in a wide range of frequencies up to the order of some gigahertz.

(2) Description of the Related Art

Surface acoustic wave devices (which will be called SAW devices) are widely used as filters or resonators in high-frequency circuits of wireless communication systems. In particular, wireless communication systems, such as handy telephones, which are lightweight, portable and operable in a desired high frequency range, utilize the SAW devices as the filters or the resonators.

Generally, single crystal or polycrystal piezoelectric substrates are used as the materials of the substrates of the SAW devices. In particular, a 64°Y-X LiNbO₃ single crystal substrate (K. Yamanouchi and K. Shibayama, J. Appl. Phys., vol.43, no.3, March 1972, pp.856) and a 36°Y-X LiTaO₃ single crystal substrate are known. In these substrates, the crystal has X, Y and Z axes, the X axis being oriented in a direction of propagation of surface acoustic waves, the Y axis being oblique to a perpendicular line normal to a cut plane of the crystal, the cut plane being rotated around the X axis at a rotated angle from the Y axis to the Z axis. In the case of the LiNbO₃ substrate, the rotated angle is set at 64°. In the case of the LiTaO₃ substrate, the rotated angle is set at 36°.

In the above-mentioned piezoelectric substrates, the electromechanical coupling coefficient is large, the efficiency of excitation of the surface acoustic waves is high, and the propagation loss in the high-frequency range is small. It is estimated that the operating characteristics of the SAW device in which electrodes, such as interdigital transducers (IDT), are formed on the cut plane of the piezoelectric substrate can be made optimum (the propagation loss being minimized) by setting the rotated angle of the crystal of the substrate at the above-mentioned angle (or 64° in the case of the LiNbO₃ substrate and 36° in the case of the LiTaO₃ substrate).

However, the SAW filter using the conventional piezoelectric substrate does not show good operating characteristics unless the effect of the mass of the electrodes (IDT) formed on the piezoelectric substrate is negligible. The effect of the mass of the electrodes (IDT) on the substrate detrimental to the operating characteristic of the SAW filter is negligibly small when the passband of the SAW filter is relatively low and of the order of some hundred megahertz (MHz). When the passband of the SAW filter is higher than the order of some hundred megahertz and rises to the order of some gigahertz (GHz), which is required for recent handy telephones, the effect of the mass of the electrodes becomes considerable and not negligible. The wavelength of the excited surface acoustic waves in such a case is extremely small, and the thickness of the electrodes relative to the wavelength of the excited surface acoustic waves cannot be ignored. The operating characteristics of the SAW filter of this type are not necessarily optimum when the passband of the SAW filter is of the order of some gigahertz.

When the passband of the SAW filter is of the order of some gigahertz, the passband frequencies of the SAW device can be lowered by increasing the thickness of the electrodes on the substrate so as to make the electromechanical coupling coefficient apparently increase. However, by such a modification, bulk waves radiated from the electrodes into the substrate are increased, and the loss of propagation of the surface acoustic waves is increased. Such bulk waves are called the surface skimming bulk waves (SSBW), and the surface acoustic waves when the bulk waves are produced are called the leaky surface acoustic waves (LSAW) for the SSBW. Some analyses on the propagation loss of the LSAW in the surface acoustic wave filters using the thickened electrodes on the 64°Y-X LiNbO₃ substrate and the 36°Y-X LiTaO₃ substrate are known (for example, V. S. Plessky and C. S. Hartmann, Proc. 1993 IEEE Ultrasonic Symp., pp.1239–1242; P. J. Edmonson and C. K. Campbell, Proc. 1994 IEEE Ultrasonic Symp., pp.75–79).

Further, in the literature by M. Ueda et al (Proc. 1994 IEEE Ultrasonic Symp., pp.143–146), it is shown that, when the SAW filter having the thickened electrodes formed on the substrate is used, the propagation speed of the surface acoustic waves (or the LSAW) and the propagation speed of the bulk waves (or the SSBW) approach each other if the thickness of the electrodes on the substrate is small, and spurious peaks in the passband of the SAW filter are produced due to the bulk waves. The spurious peaks are detrimental to the steepness of the band-pass characteristics of the SAW filter.

A description will be given of band-pass characteristics of a conventional SAW filter in the above-mentioned literature of M. Ueda et al with reference to FIG. 20.

The conventional SAW filter has a piezoelectric substrate on which aluminum—1% copper electrodes are formed with a given thickness. Specifically, the piezoelectric substrate is the 36°Y-X LiTaO₃ single crystal substrate mentioned above. The crystal of this substrate has X, Y and Z axes and a cut plane, the X axis oriented in a direction of propagation of surface acoustic waves, the Y axis being oblique to a perpendicular line normal to the cut plane of the crystal, the cut plane being rotated around the X axis at the rotated angle of 36° from the Y axis to the Z axis.

The electrodes of aluminum—1% copper alloy which are formed on the substrate are the interdigital transducers (IDT). The thickness of the electrodes is 0.49 $\mu$m. This thickness is equivalent to 3% of the wavelength of the excited surface acoustic waves.

As shown in FIG. 20, in the band-pass characteristics of the conventional SAW filter, a spurious peak "A" near the passband of the SAW filter and a spurious peak "B" outside the passband of the SAW filter are produced. The steepness of the band-pass characteristics of the conventional SAW filter is degraded.

In the above conventional SAW filter, the propagation speed of the surface acoustic waves (the LSAW) depends on the thickness of the electrodes on the substrate (or the mass of the electrodes), but the propagation speed of the bulk waves (the SSBW) is independent of the thickness of the electrodes on the substrate. When the frequency band is above the frequency range of some gigahertz, the ratio of the thickness of the electrodes to the wavelength of the excited surface acoustic waves is increased, and the propagation speed of the LSAW relative to the propagation speed of the SSBW is lowered. The passband of the conventional SAW filter in such a case is shifted from the spurious peaks, and the band-pass characteristics of the conventional SAW filter become flattened.

If the ratio of the thickness of the electrodes on the substrate to the wavelength of the excited surface acoustic waves is increased, the propagation loss of the LSAW due to the SSBW is increased. This is the reason why the steepness of the band-pass characteristics of the conventional SAW filter is degraded.

Therefore, in a SAW filter which is operable at desired frequencies of the order of some gigahertz, it is necessary to ensure a certain amount of the thickness of the electrodes on the substrate and decrease the resistance of the IDT. On the other hand, when the conventional SAW filter is used, it is difficult to avoid the increase of the propagation loss of the surface acoustic waves which causes the degradation of the steepness of the band-pass characteristics.

Japanese Patent Application No. 7-265466, which is assigned to the assignee of the present invention, discloses an improved SAW device which is intended to prevent the increase of the propagation loss of the surface acoustic waves. A description will be given of the improved SAW device disclosed in the above patent application.

In the above-mentioned patent application, it has been shown that the operating characteristics of the improved SAW device when it is operated at frequencies of the order of some gigahertz can be made optimum (or the propagation loss can be made minimum) by shifting the rotated angle of the cut plane of the crystal of the substrate to an increased angle greater than the above-mentioned angle 36°.

As described above, the effect of the mass of the electrodes when it is operated at frequencies of the order of some gigahertz becomes considerable and not negligible. The wavelength of the excited surface acoustic waves in such a case is extremely small, and the thickness of the electrodes relative to the wavelength of the excited surface acoustic waves cannot be ignored. However, it is shown that, in the improved SAW device, by shifting the rotated angle of the cut plane of the crystal of the substrate to the increased angle greater than the above-mentioned angle 36°, the effect of the mass of the electrodes detrimental to the operating characteristics of the SAW device can be eliminated.

In the SAW device of the above-mentioned patent application, the piezoelectric substrate is made of a LiTaO$_3$ single crystal, the crystal having X, Y and Z axes and a cut plane, the X axis oriented in the direction of propagation of the surface acoustic waves, the cut plane being rotated around the X axis at an increased rotated angle from the Y axis to the Z axis, the increased rotated angle being in a range between 38° and 46°. It is shown that the SAW filter of the above-mentioned patent application achieves a high level of the quality factor Q, and passes the desired high frequencies of the order of some gigahertz with the steepness of the band-pass characteristics.

However, if the rotated angle of the cut plane of the crystal of the substrate is shifted to the increased angle as in the improved SAW device of the above-mentioned patent application, basic parameters which determine operating characteristics of the SAW device, such as the coupling coefficient, the reflection coefficient and other related coefficients, must be changed in accordance with the change of the rotated angle. It is not shown in the above-mentioned patent application what values of the basic parameters are appropriate to obtain optimum operating characteristics of the improved SAW device. The values of the basic parameters which provide optimum operating characteristics of the conventional SAW devices having the 36°Y-X LiTaO$_3$ substrate are different from those providing the optimum operating characteristics of the improved SAW device. It is desirable to determine appropriate values of the basic parameters of the improved SAW device that attain the optimum band-pass characteristics.

SUMMARY OF THE INVENTION

An object of the present invention is to provide a surface acoustic wave device in which the rotated angle of the cut plane of the crystal of the piezoelectric substrate is shifted to an increased angle, and the basic parameters which determine operating characteristics of the surface acoustic wave device are set at appropriate values that attain the optimum operating characteristics of the surface acoustic wave device.

The above-mentioned object of the present invention are achieved by a surface acoustic wave device which comprises: a piezoelectric substrate of a LiTaO$_3$ single crystal, the crystal having X, Y and Z axes and a cut plane, the X axis oriented in a direction of propagation of surface acoustic waves, the cut plane being rotated around the X axis at a rotated angle from the Y axis to the Z axis, the rotated angle being in a range between 40° and 42°; a pair of reflectors formed on the cut plane of the substrate and aligned in a row in the direction of propagation; and interdigital transducers formed on the cut plane of the substrate and aligned in the same row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer which are aligned in this order in the direction of propagation, wherein a ratio of the number of pairs of the primary and the secondary electrode fingers in one of the front transducer and the rear transducer to the number of pairs of the primary and the secondary electrode fingers in the middle transducer is in a range of percentages between 55% and 80%.

In the surface acoustic wave device of the present invention, the basic parameters which determine the operating characteristics of the surface acoustic wave device are set at appropriate values that provide the optimum operating characteristics of the surface acoustic wave device. It is possible for the surface acoustic wave device of the present invention to provide a wide range of the bandwidth and a desired impedance characteristic for a practical SAW band-pass filter while providing a reduced propagation loss.

Further, in the surface acoustic wave device of the present invention, it is possible for both the multiple-mode filter with a low passband and the ladder filter with a high passband to be formed on the same substrate having the crystal with the increased rotated angle of the cut plane. The thickness of the electrodes for the multiple-mode filter and the thickness of the electrodes for the ladder filter can be the same. Therefore, the present invention allows the production of the surface acoustic wave device to be efficiently performed, and the cost is remarkably reduced.

BRIEF DESCRIPTION OF THE DRAWINGS

The above and other objects, features and advantages of the present invention will be more apparent from the following detailed description when read in conjunction with the accompanying drawings in which:

FIG. 2 is a graph for explaining a relationship between the impedance and the finger-pair number ratio of the SAW device of FIG. 1A;

DESCRIPTION OF THE PREFERRED EMBODIMENTS

A description will now be given of the preferred embodiments of the present invention with reference to the accompanying drawings.

Figure 1A:
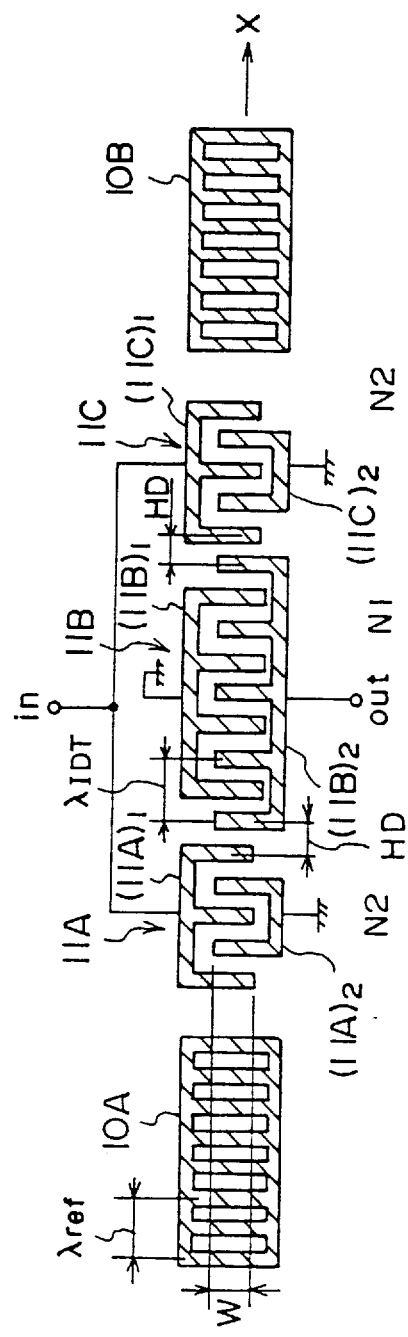
FIGS. 1A and 1B are diagrams showing a first embodiment of the surface acoustic wave (SAW) device of the present invention.

FIG. 1A shows a first embodiment of the surface acoustic wave (SAW) device of the present invention. The SAW device of this embodiment is a two-input SAW band-pass filter to which the present invention is applied. This SAW device comprises a pair of reflectors 10A and 10B and three interdigital transducers (IDT) 11A, 11B and 11C, which are formed on a piezoelectric substrate (not shown).

In the present embodiment of FIG. 1A, the interdigital transducers (IDT) are called the electrodes for the sake of convenience. Also, for the sake of convenience, the reflector 10A is called the front reflector, the reflector 10B is called the rear reflector, the electrode 11A is called the front electrode, the electrode 11B is called the middle electrode, and the electrode 11C is called the rear electrode.

The piezoelectric substrate of this embodiment is made of a LiTaO$_3$ single crystal, the crystal having X, Y and Z axes, the X axis oriented in a direction of propagation of surface acoustic waves, the Y axis being oblique to a perpendicular line normal to a cut plane of the crystal, the cut plane being rotated around the X axis at a rotated angle from the Y axis to the Z axis, the rotated angle being in a range of 40° to 42°. By placing the reflectors 10A and 10B and the electrodes 11A, 11B and 11C on the cut plane of this substrate, the SAW device of this embodiment achieves a high level of the quality factor Q, and passes the desired frequencies of the order of some gigahertz with a small attenuation of the surface acoustic waves.

In FIG. 1A, the arrow "X" indicates the direction (or the X axis of the crystal) of propagation of the surface acoustic waves in the SAW device. As shown in FIG. 1A, the reflector 10A, the electrodes 11A, 11B and 11C, and the reflector 10B are aligned in a row in the direction X in this order.

The reflector 10A and the reflector 10B are respectively arranged at the front end and at the rear end of the electrodes 11A–11C. The reflectors 10A and 10B serve to define the path of the surface acoustic waves propagating in the piezoelectric substrate in the direction "X".

As shown in FIG. 1A, each of the electrodes 11A, 11B and 11C includes pairs of primary electrode fingers and secondary electrode fingers which confront each other. That is, the front electrode 11A includes pairs of primary electrode fingers $(11A)_1$ and secondary electrode fingers $(11A)_2$, the middle electrode 11B includes pairs of primary electrode fingers $(11B)_1$ and secondary electrode fingers $(11B)_2$, and the rear electrode 11C includes pairs of primary electrode fingers $(11C)_1$ and secondary electrode fingers $(11C)_2$. Similarly to the known interdigital transducers, the primary electrode fingers and the secondary electrode fingers of the electrodes 11A, 11B and 11C are arrayed in the direction X in an alternate manner, and intersect the path of propagation of the surface acoustic waves in the piezoelectric substrate in the direction X.

In the SAW device of FIG. 1A, the primary electrode fingers $(11A)_1$ of the front electrode 11A and the primary electrode fingers $(11C)_1$ of the rear electrode 11C are electrically connected to an input terminal "in", and the secondary electrode fingers $(11A)_2$ and the secondary electrode fingers $(11C)_2$ are grounded. The secondary electrode fingers $(11B)_2$ of the middle electrode 11B are electrically connected to an output terminal "out", and the primary electrode fingers $(11B)_1$ are grounded. That is, the SAW device has two inputs and one output to form a two-input SAW band-pass filter.

Figure 1B:
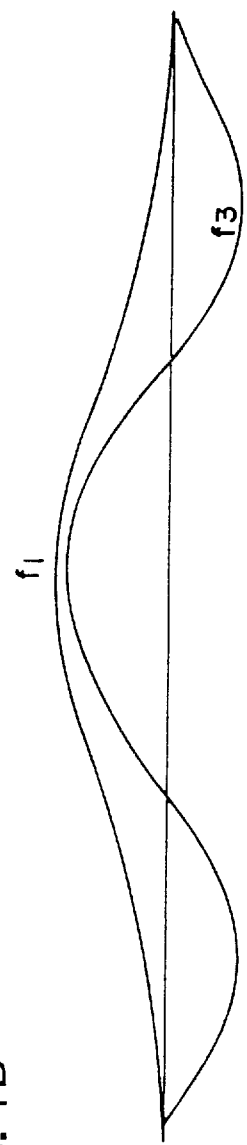

FIG. 1B shows an energy distribution of the surface acoustic waves in the SAW device of FIG. 1A in each of a first mode and a third mode. The SAW band-pass filter of this embodiment utilizes the first mode and the third mode to provide a band-pass characteristic including the pass-band frequencies between a frequency "f1" of the first mode and a frequency "f3" of the third mode as shown in FIG. 1B.

FIG. 2 shows a relationship between the impedance and the finger-pair number ratio of the SAW device of FIG. 1A. The finger-pair number ratio represents a ratio of the number (N2) of pairs of the electrode fingers in one of the front electrode 11A and the rear electrode 11C to the number (N1) of pairs of the electrode fingers in the middle electrode 11B.

In the embodiment of FIG. 1A, the number of pairs of the electrode fingers in the front electrode 11A is the same as the number of pairs of the electrode fingers in the rear electrode 11C, and both the numbers of pairs of the electrode fingers are indicated by "N2" in FIG. 1A. That is, the configuration of the SAW device of FIG. 1A is symmetrical about the center of the SAW device.

In FIG. 2, the solid line indicates a change of the input terminating impedance of the SAW device when the finger-pair number ratio "N2/N1" related to the SAW device is varied, and the dotted line indicates a change of the output terminating impedance of the SAW device when the finger-pair number ratio "N2/N1" related to the SAW device is varied. In order to enable the SAW device to function as a practical high-frequency device, it is desirable that the input terminating impedance and the output terminating impedance are set at about 50Ω. A requirement of the impedance for the practical high-frequency device is that both the input terminating impedance and the output terminating impedance are below 59Ω.

In the characteristics shown in FIG. 2, the input terminating impedance tends to increase as the finger-pair number ratio "N2/N1" increases. It is found that when the finger-pair number ratio "N2/N1" is below 80%, the input terminating impedance is below 59Ω. As shown in FIG. 2, the output terminating impedance tends to decrease as the finger-pair number ratio "N2/N1" increases. It is found that when the finger-pair number ratio "N2/N1" is above 55%, the output terminating impedance is below 59Ω. Therefore, the requirement of the impedance for the practical high-frequency device is met by setting the finger-pair number ratio "N2/N1" of the SAW device in a range of percentages between 55% and 80%.

Figure 3:
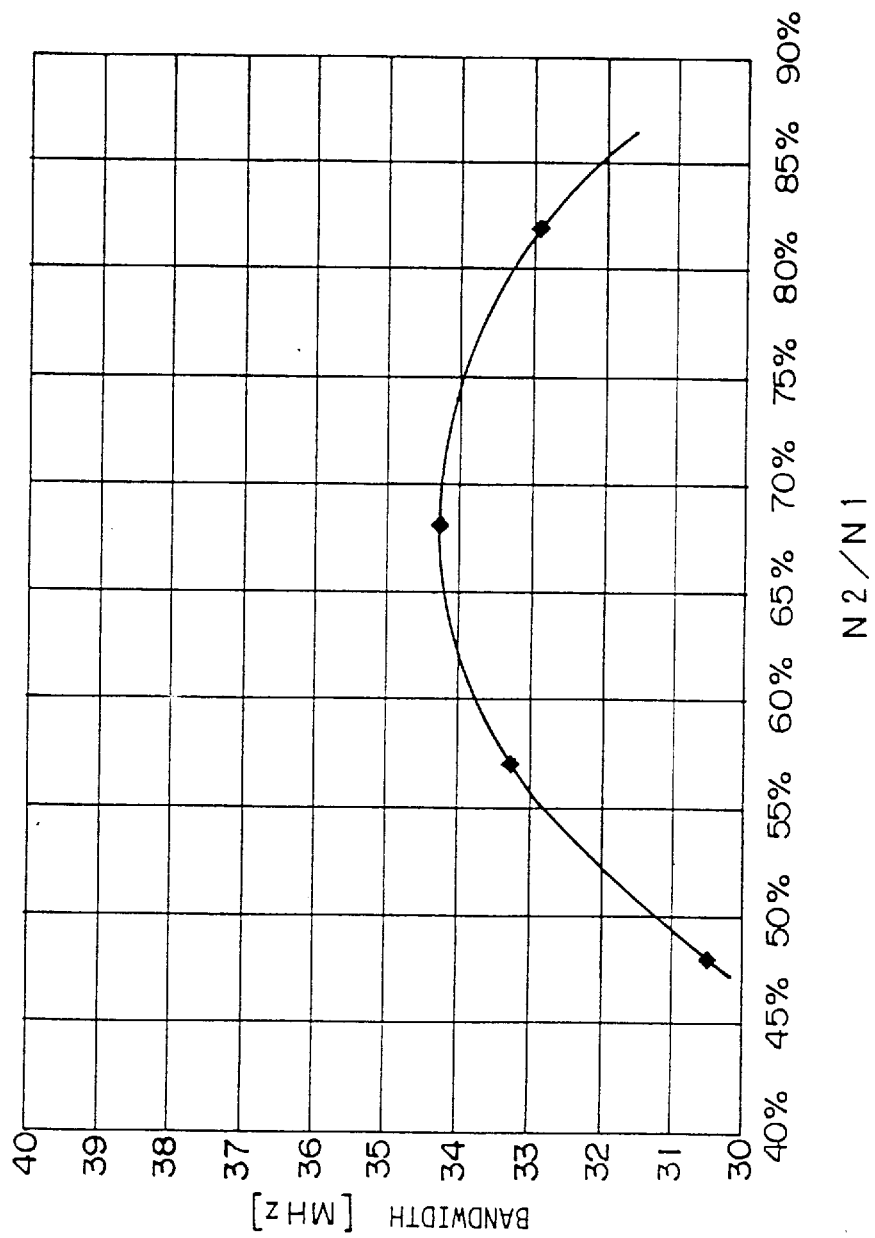
FIG. 3 is a graph for explaining a relationship between the bandwidth and the finger-pair number ratio of the SAW device of FIG. 1A.

FIG. 3 shows a relationship between the bandwidth and the finger-pair number ratio of the SAW device of FIG. 1A.

As shown in FIG. 3, it is found that the bandwidth of the SAW device is at the maximum level when the finger-pair number ratio "N2/N1" is about 70%. The bandwidth tends to increase to the maximum level when the finger-pair number ratio "N2/N1" increases to about 70%. The bandwidth tends to decrease from the maximum level when the finger-pair number ratio "N2/N1" increases further from about 70%. A requirement of the bandwidth for a practical SAW band-pass filter is that the bandwidth of the SAW device of FIG. 1A be higher than 33 MHz. The requirement of the bandwidth for the practical SAW band-pass filter is met by setting the finger-pair number ratio "N2/N1" in a range of percentages between 55% and 80%.

According to the results of FIGS. 2 and 3, the finger-pair number ratio "N2/N1" in the SAW device of the present embodiment (which is the ratio of the number (N2) of pairs of the electrode fingers in one of the front electrode 11A and the rear electrode 11C to the number (N1) of pairs of the electrode fingers in the middle electrode 11B) is set in a range of percentages between 55% and 80%. Therefore, it is possible for the SAW device of the present embodiment to provide a wide range of the bandwidth for the practical SAW band-pass filter and meet the requirement of the impedance for the practical high-frequency device. Further, it is possible that the performance of the SAW device of the present embodiment approaches the desired requirement (about 50Ω) of the impedance for the practical high-frequency device.

In particular, by setting the finger-pair number ratio "N2/N1" in the SAW device of the present embodiment in a range of percentages between 65% and 75%, it is possible to provide a wider bandwidth range above 34 MHz. This makes it possible to provide a better bandwidth characteristic for the SAW band-pass filter.

Figure 4:
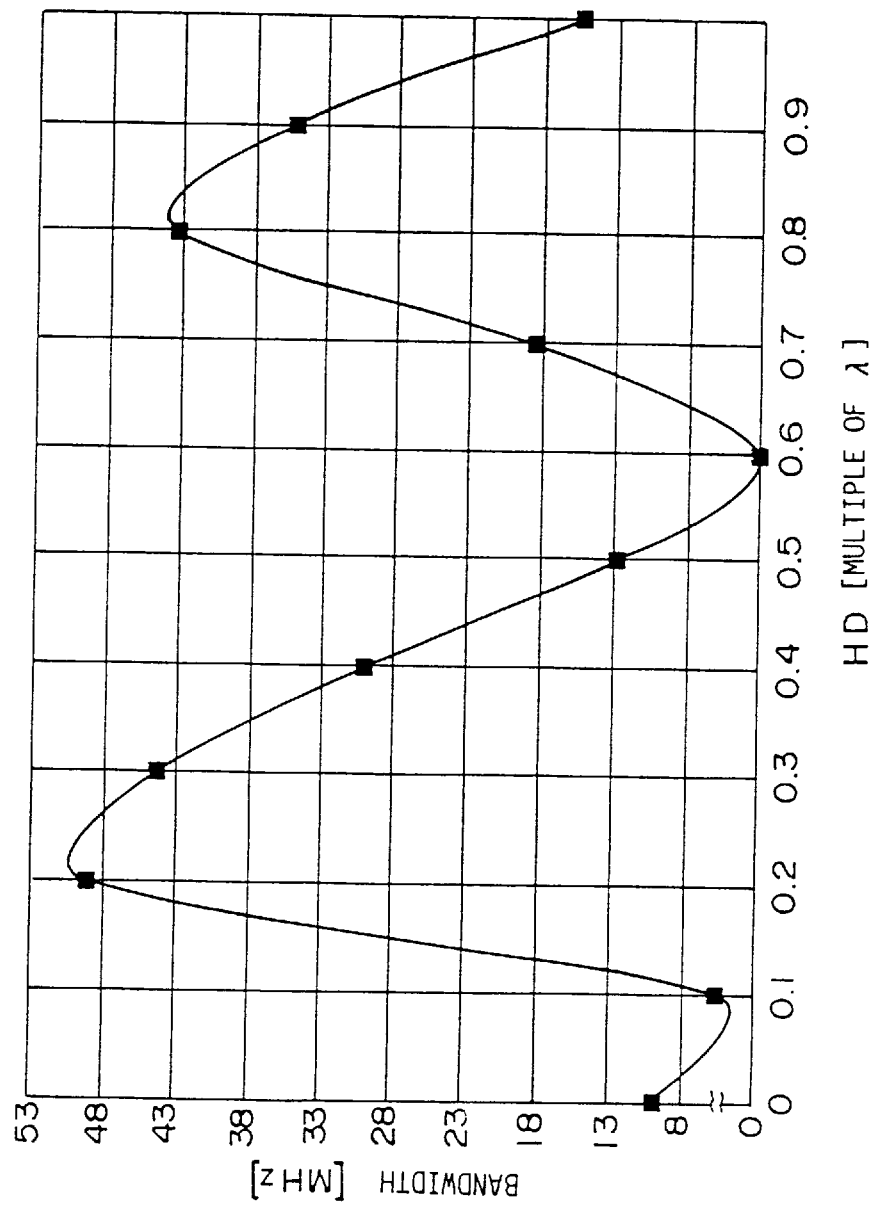
FIG. 4 is a graph for explaining a relationship between the bandwidth and the electrode-to-electrode pitch of the SAW device of FIG. 1A.

FIG. 4 shows a relationship between the bandwidth and the electrode-to-electrode pitch "HD" of the SAW device of FIG. 1A. The results of the characteristics of the SAW device are obtained through simulation. As shown in FIG. 4, the electrode-to-electrode pitch "HD" represents a distance between the rear-end electrode finger of the front electrode 11A and the front-end electrode finger of the middle electrode 11B along the direction X. More precisely, the pitch "HD" indicates a distance between the centerline of the rear-end electrode finger of the front electrode 11A and the centerline of the front-end electrode finger of the middle electrode 11B along the direction X.

Since the configuration of the SAW device of FIG. 1A is symmetrical about the center of the SAW device, the electrode-to-electrode pitch "HD" also represents a distance between the rear-end electrode finger of the middle electrode 11B and the front-end electrode finger of the rear electrode 11C along the direction X.

In FIG. 4, the electrode-to-electrode pitch "HD" is indicated by a fractional multiple of the wavelength ("lambda") of the surface acoustic waves propagating in the SAW device.

As described above, the requirement of the bandwidth for the practical SAW band-pass filter is that the bandwidth of the SAW device be higher than 33 MHz. In the characteristics of FIG. 4, it is found that when the electrode-to-electrode pitch "HD" in the SAW device of FIG. 1A is in a range between 0.75×"lambda" and 0.90×"lambda", the requirement of the bandwidth for the practical SAW band-pass filter is met.

According to the results of FIG. 4, the electrode-to-electrode pitch "HD" as a fractional multiple of the wavelength of the surface acoustic waves in the SAW device of the present embodiment is set in a range between 0.75 and 0.90. Therefore, it is possible for the SAW device of the present embodiment to provide a wide range of the bandwidth for the practical SAW band-pass filter.

In the characteristics of FIG. 4, it is found that when the electrode-to-electrode pitch "HD" is in a range between 0.17×"lambda" and 0.38×"lambda", the requirement of the bandwidth for the practical SAW band-pass filter is met. However, when the electrode-to-electrode pitch "HD" is below 0.50×"lambda", the surface acoustic waves propagating in the piezoelectric substrate under the electrode fingers of the electrodes 11A, 11B and 11C may encounter interference. It is impossible to set the electrode-to-electrode pitch "HD" of the practical SAW band-pass filter in a range below 0.50×"lambda".

Figure 5:
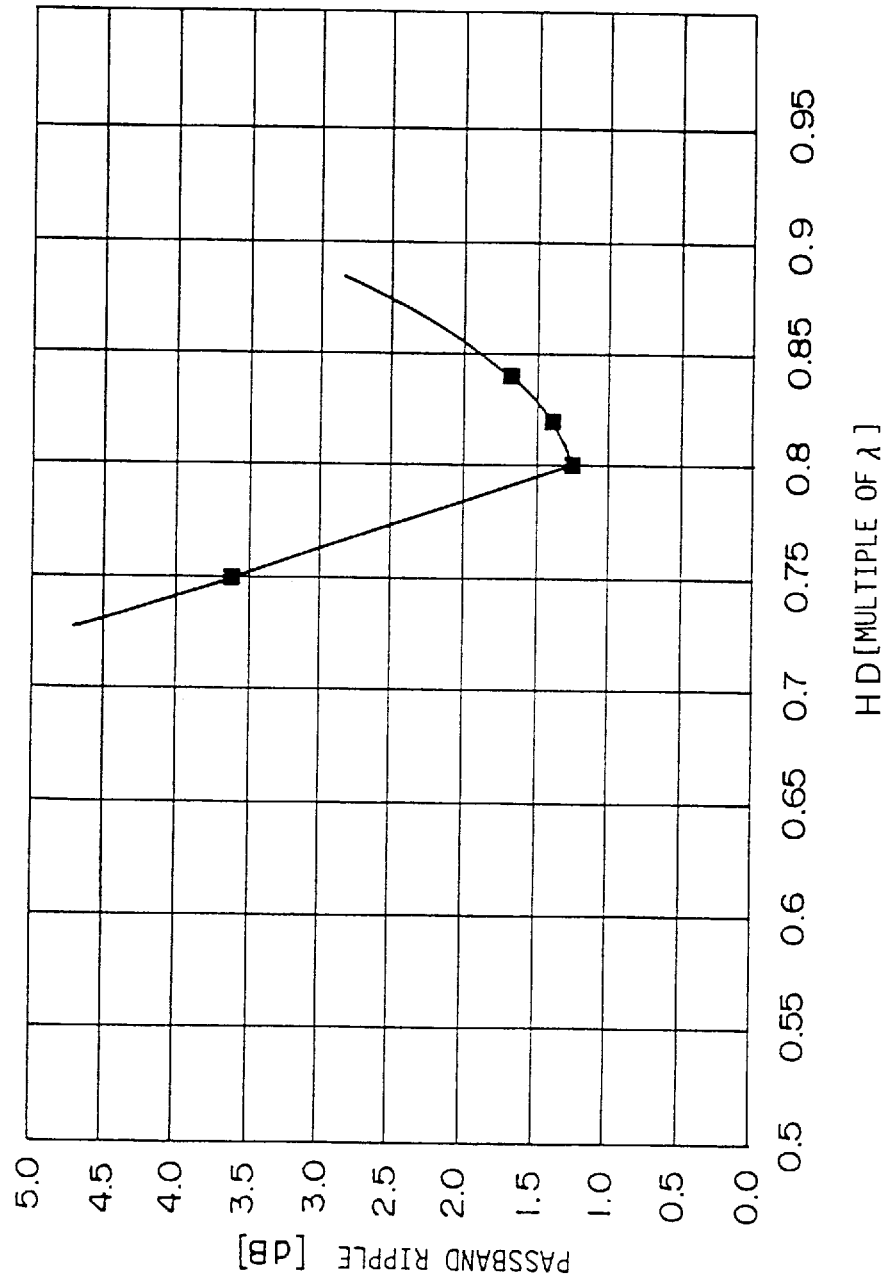
FIG. 5 is a graph for explaining a relationship between the passband ripple and the electrode-to-electrode pitch of the SAW device of FIG. 1A.

FIG. 5 shows a relationship between the passband ripple and the electrode-to-electrode pitch "HD" of the SAW device of FIG. 1A. The passband ripple represents a quantity of pulsating components in the surface acoustic waves at a given passband frequency.

In FIG. 5, the electrode-to-electrode pitch "HD" is indicated by a fractional multiple of the wavelength ("lambda") of the surface acoustic waves propagating in the SAW device.

It is desirable that no passband ripple takes place in the SAW device. However, practically, it is very difficult to avoid the passband ripple in the SAW device. A requirement of the passband ripple for the practical SAW band-pass filter is that the passband ripple of the SAW device be lower than 2.0 dB.

In the characteristics of FIG. 5, it is found that the passband ripple is at the minimum level when the electrode-to-electrode pitch "HD" is about 0.80×"lambda". The passband ripple tends to decrease to the minimum level when the pitch "HD" increases to about 0.80×"lambda". The passband ripple tends to increase from the minimum level when the pitch "HD" further increases from about 0.80×"lambda". As shown in FIG. 5, when the electrode-to-electrode pitch "HD" in the SAW device of FIG. 1A is in a range between 0.78×"lambda" and 0.85×"lambda", the requirement of the passband ripple for the practical SAW band-pass filter is met.

According to the results of FIG. 5, the electrode-to-electrode pitch "HD" as a fractional multiple of the wavelength of the surface acoustic waves in the SAW device of the present embodiment is set in a range between 0.78 and 0.85. Therefore, it is possible for the SAW device of the present embodiment to effectively reduce the passband ripple which is detrimental to the passband characteristic of the practical SAW band-pass filter.

Figure 6:
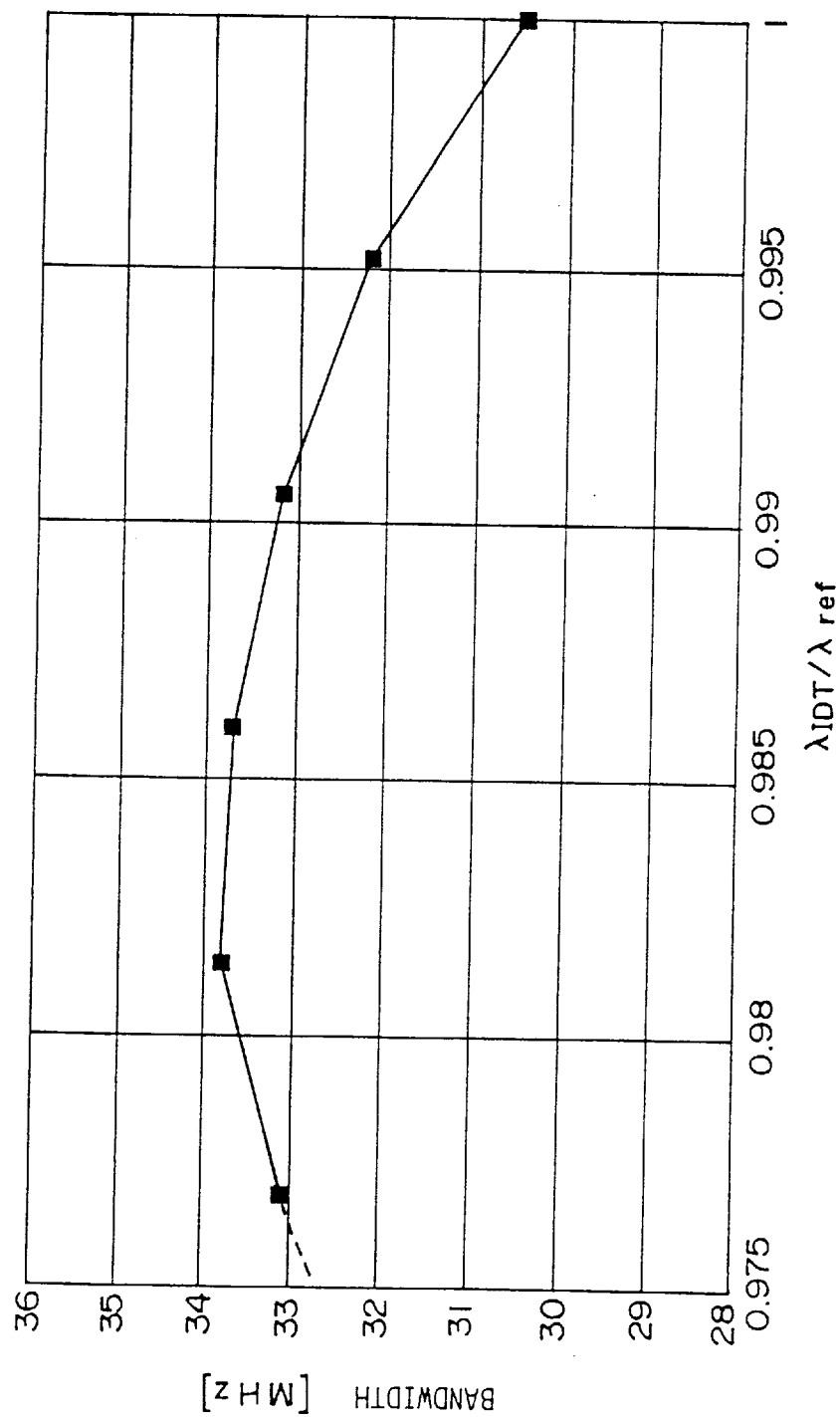
FIG. 6 is a graph for explaining a relationship between the bandwidth and the interval ratio of the SAW device of FIG. 1A.

FIG. 6 shows a relationship between the bandwidth and the interval ratio of the SAW device of FIG. 1A. The interval ratio represents a ratio of a distance ("lambda(IDT)") between two of the electrode fingers in the electrodes 11A, 11B and 11C in the direction X to a distance ("lambda(ref)") between two of the gratings in the reflectors 10A and 10B in the direction X, as shown in FIG. 1A. In FIG. 6, the interval ratio "lambda(IDT)/lambda(ref)" of the SAW device of FIG. 1A is indicated as a fractional number.

In the characteristics of FIG. 6, it is found that when the interval ratio "lambda(IDT)/lambda(ref)" of the SAW device of FIG. 1A is about 0.982, the bandwidth of the SAW device is at the maximum level. The bandwidth tends to gradually increase to the maximum level when the ratio "lambda(IDT) /lambda(ref)" increases to about 0.982. The bandwidth tends to gradually decrease from the maximum level when the ratio "lambda(IDT)/lambda(ref)" further increases from about 0.982. As described above, the requirement of the bandwidth for the practical SAW band-pass filter is that the bandwidth of the SAW device be higher than 33 MHz.

According to the results of FIG. 6, the interval ratio "lambda(IDT)/lambda(ref)" in the SAW device of the present embodiment is set in a range between 0.977 and 0.992, which meets the requirement of the bandwidth for the practical SAW band-pass filter. Therefore, it is possible for the SAW device of the present embodiment to provide a wide range of the bandwidth for the practical SAW band-pass filter.

Figure 7:
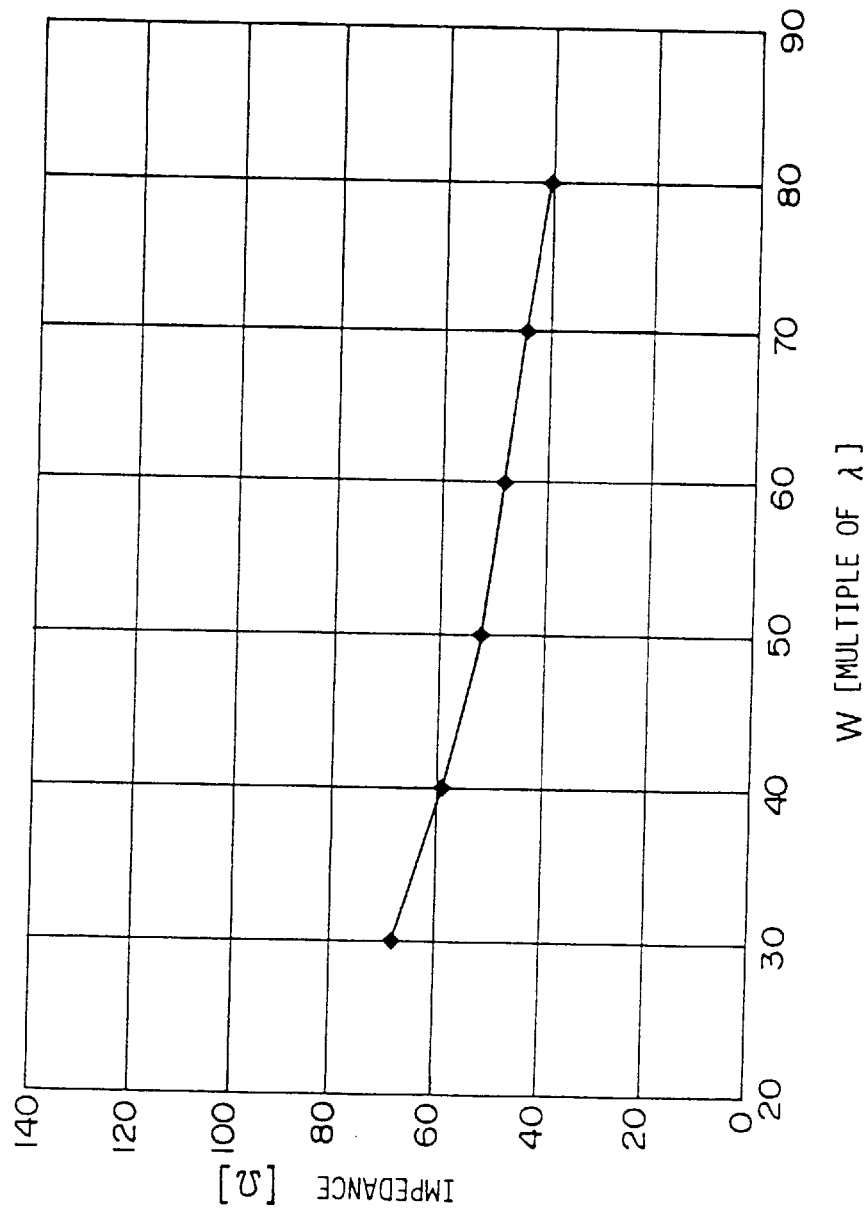
FIG. 7 is a graph for explaining a relationship between the impedance and the aperture length of the SAW device of FIG. 1A.
Figure 8:
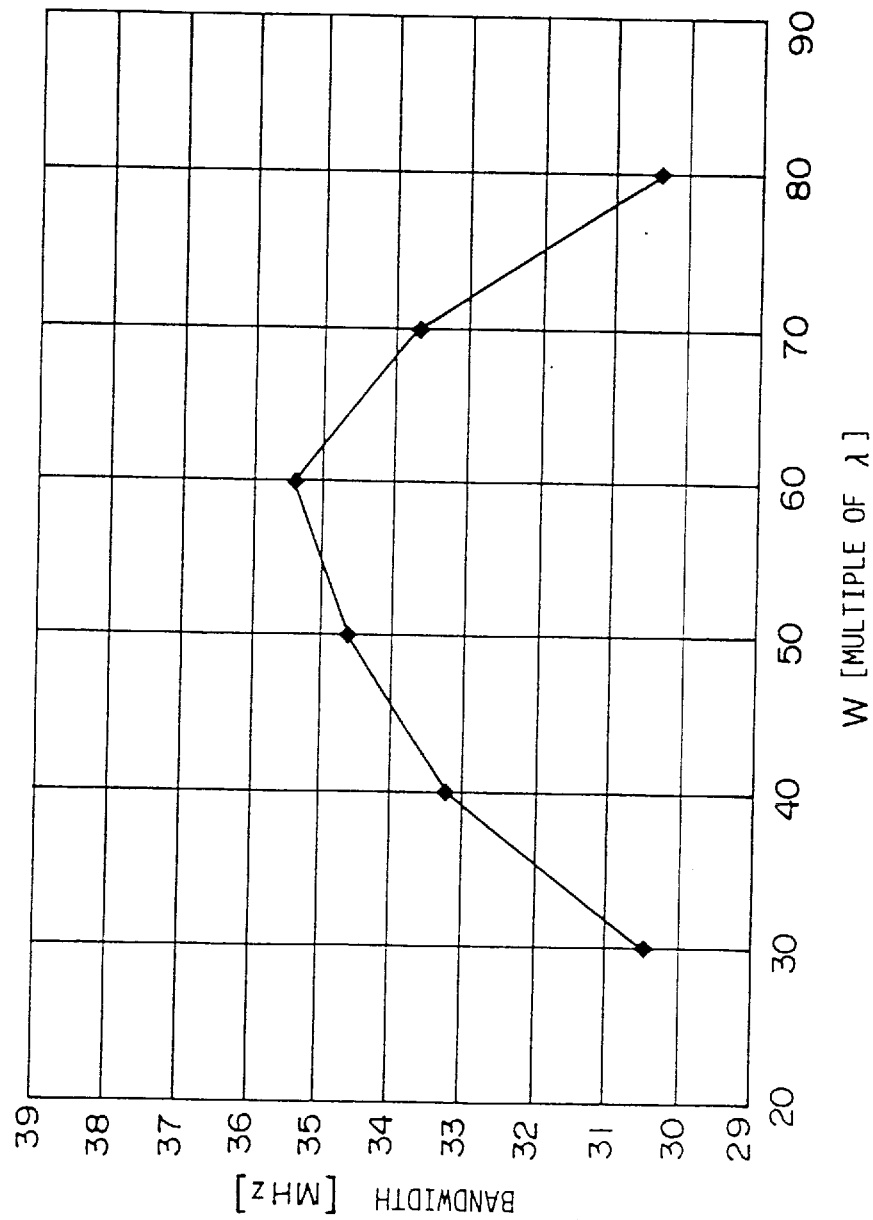
FIG. 8 is a graph for explaining a relationship between the bandwidth and the aperture length of the SAW device of FIG. 1A.

FIG. 7 shows a relationship between the impedance and the aperture length "W" of the SAW device of FIG. 1A. FIG. 8 shows a relationship between the bandwidth and the aperture length "W" of the SAW device of FIG. 1A. The aperture length "W" represents a length between the primary electrode finger edge and the secondary electrode finger edge in the electrodes 11A, 11B and 11C in a lateral direction perpendicular to the direction X, as shown in FIG. 1A.

In FIGS.7 and 8, the aperture length "W" is indicated by a multiple of the wavelength ("lambda") of the surface acoustic waves propagating in the SAW device.

In the characteristics of FIG. 7, it is found that when the aperture length "W" increases, the impedance of the SAW device of the present embodiment tends to gradually decrease. As described above, the desired requirement of the impedance for the practical high-frequency device is that both the input terminating impedance and the output terminating impedance of the SAW device are about 50Ω. Therefore, a permissible requirement of the impedance for the practical SAW band-pass filter is that the impedance of the SAW device of FIG. 1A is in a range between 40Ω and 60Ω.

According to the results of FIG. 7, the aperture length "W" in the SAW device of the present embodiment, indicated by a multiple of the wavelength ("lambda") of the surface acoustic waves, is set in a range between 40 and 80, which meets the permissible requirement of the impedance for the practical SAW band-pass filter. Therefore, it is possible that the SAW device of the present embodiment provides a desired impedance characteristic of the practical SAW band-pass filter.

In the characteristics of FIG. 8, it is found that when the aperture length "W" of the SAW device of FIG. 1A is equal to 60×"lambda", the bandwidth of the SAW device is at the maximum level. The bandwidth tends to increase to the maximum level when the aperture length "W" increases from 30×"lambda" to 60×"lambda". The bandwidth tends to rapidly decrease from the maximum level when the aperture length "W" further increases from 60×"lambda". As described above, the requirement of the bandwidth for the practical SAW band-pass filter is that the bandwidth of the SAW device be higher than 33 MHz.

According to the results of FIG. 8, the aperture length "W" in the SAW device of the present embodiment, indicated by a multiple of the wavelength ("lambda") of the surface acoustic waves, is set in a range between 40 and 70, which meets the requirement of the bandwidth for the practical SAW band-pass filter. Therefore, it is possible for the SAW device of the present embodiment to provide a wide range of the bandwidth for the practical SAW band-pass filter. Further, according to the results of the characteristics of FIG. 7, it is possible for the SAW device of the present embodiment to provide a desired impedance characteristic of the practical SAW band-pass filter.

Figure 9:
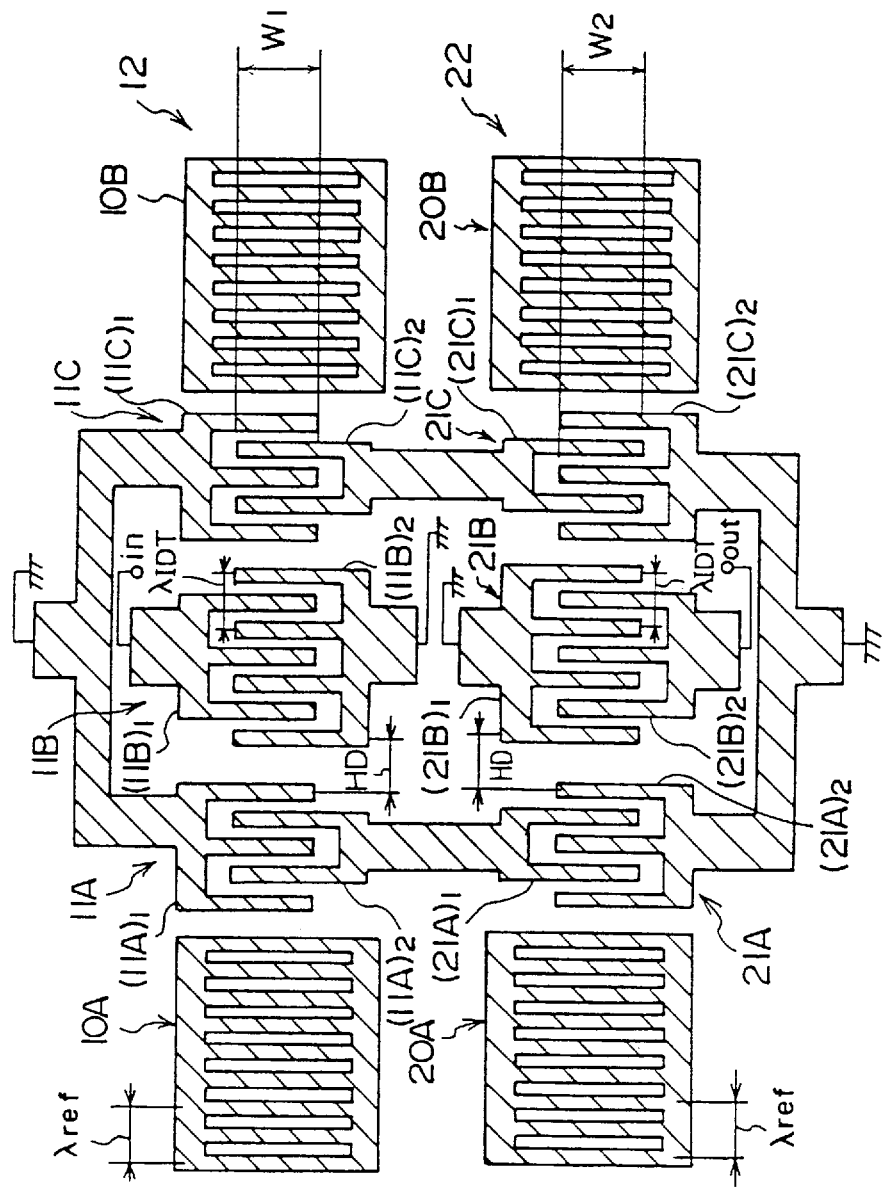
FIG. 9 is a diagram showing a second embodiment of the SAW device of the present invention.

FIG. 9 shows a second embodiment of the surface acoustic wave (SAW) device of the present invention. In FIG. 9, the elements which are the same as corresponding elements in FIG. 1A are designated by the same reference numerals, and a description thereof will be omitted.

The SAW device of FIG. 9 comprises a first SAW filter 12 and a second SAW filter 22 which are connected in a cascade connection.

In the SAW device of FIG. 9, reflectors and interdigital transducers (IDT) in each of the first SAW filter 12 and the second SAW filter 22 are formed on a piezoelectric substrate (not shown) which is the same as the piezoelectric substrate of the SAW device of FIG. 1A. That is, the piezoelectric substrate of this embodiment is made of a $LiTaO_3$ single crystal, the crystal having X, Y and Z axes, the X axis oriented in a direction of propagation of surface acoustic waves, the Y axis being oblique to a perpendicular line normal to a cut plane of the crystal, the cut plane being rotated around the X axis at a rotated angle from the Y axis to the Z axis, the rotated angle being in a range of 40° to 42°. By placing the reflectors and the electrodes on the cut plane of this substrate, the SAW device of this embodiment achieves a high level of the quality factor Q, and passes the desired frequencies of the order of some gigahertz with a small attenuation of the surface acoustic waves.

Similar to the SAW device of FIG. 1A, the first SAW filter 12 comprises the front reflector 10A, the front electrode 11A, the middle electrode 11B, the rear electrode 11C, and the rear reflector 10B, which are aligned, in this order, in a row in the direction of propagation of the surface acoustic waves. Further, the second SAW filter 22 comprises a pair of reflectors 20A and 20B and three interdigital transducers (IDT) 21A, 21B and 21C. That is, the second SAW filter 22 comprises a front reflector 20A, a front electrode 21A, a middle electrode 21B, a rear electrode 21C, and a rear reflector 20B, which are aligned, in this order, in another row in the direction of propagation of the surface acoustic waves.

In the SAW device of FIG. 9, the secondary electrode fingers $(11A)_2$ in the first SAW filter 12 are electrically connected to the primary electrode fingers $(21A)_1$ in the second SAW filter 22, and the secondary electrode fingers $(11C)_2$ in the first SAW filter 12 are electrically connected to the primary electrode fingers $(21C)_1$ in the second SAW filter 22. That is, the first SAW filter 12 and the second SAW filter 22 are connected in a cascade connection.

In the SAW device of FIG. 9, the primary electrode fingers $(11A)_1$ of the front electrode 11A and the primary electrode fingers $(11C)_1$ of the rear electrode 11C are grounded in common. The secondary electrode fingers $(21A)_2$ of the front electrode 21A and the secondary electrode fingers $(21C)_2$ of the rear electrode 21C are grounded in common. The primary electrode fingers $(11B)_1$ of the middle electrode 11B are electrically connected to an input pad of the SAW device, and the secondary electrode fingers $(21B)_2$ of the middle electrode 21B are electrically connected to an output pad of the SAW device. The secondary electrode fingers $(11B)_2$ of the middle electrode 11B are grounded, and the primary electrode fingers $(21B)_1$ of the middle electrode 21B are grounded.

In the SAW device of FIG. 9, the aperture length "W1" related to the first SAW filter 12 is different from the aperture length "W2" related to the second SAW filter 22. Consequently, the input terminating impedance of the SAW device is different from the output terminating impedance of the SAW device. The input terminating impedance of the entire SAW device depends on the input terminating impedance of the first SAW filter 12 having the aperture length "W1", and the output terminating impedance of the entire SAW device depends on the output terminating impedance of the second SAW filter 22 having the aperture length "W2".

Generally, it is known that the input and output terminating impedances of a SAW filter are inversely proportional to the finger-pair number and the aperture length. Since the finger-pair number is a parameter which determines a passband characteristic of the SAW filter, it is impossible to set the finger-pair number at an arbitrary value independent of the passband characteristic of the SAW filter. On the other hand, the aperture length can be set at an arbitrary value independent of the passband characteristic of the SAW filter. The SAW device of the present embodiment is useful for a practical SAW band-pass filter in which the input terminating impedance and the output terminating impedance are different from each other.

In the SAW device of FIG. 9, by setting the aperture length "W1" and the aperture length "W2" independently of each other, it is possible for the input terminating impedance of the first SAW filter 12 and the output terminating impedance of the second SAW filter 22 to be freely adjusted in accordance with the desired input and output terminating impedances of the entire SAW device.

More specifically, in the SAW device of FIG. 9, the aperture length "W1" for the first SAW filter 12, which is indicated by a multiple of the wavelength of the surface acoustic waves, is set in a range between 40 and 60 exclusive of the upper limit 60, and the aperture length "W2" for the second SAW filter 22, which is indicated by a multiple of the wavelength of the surface acoustic waves, is set in a range between 20 and 60 exclusive of the upper limit 60. The value of the aperture length "W1" is different from the value of the aperture length "W2".

Other parameters of each of the first and second SAW filters 12 and 22 which determine various characteristics of the SAW device of FIG. 9 are set at appropriate values similarly to corresponding parameters of the SAW device of FIG. 1A. That is, the finger-pair ratio "N2/N1" for each of the first SAW filter 12 and the second SAW filter 22 is set in a range of percentages between 55% and 80%. The electrode-to-electrode pitch "HD" as a fractional multiple of the wavelength of the surface acoustic waves for each of the first SAW filter 12 and the second SAW filter 22 is set in a range 0.75 and 0.90. The interval ratio "lambda(IDT)/lambda(ref)" for each of the first SAW filter 12 and the second SAW filter 22 is set in a range between 0.977 and 0.992. In particular, when the finger-pair ratio "N2/N1" for each of the first SAW filter 12 and the second SAW filter 22 is set in a range of percentages between 65% and 75%, it is possible for the SAW device of the present embodiment to provide a better bandwidth characteristic for the practical SAW band-pass filter.

Figure 19:
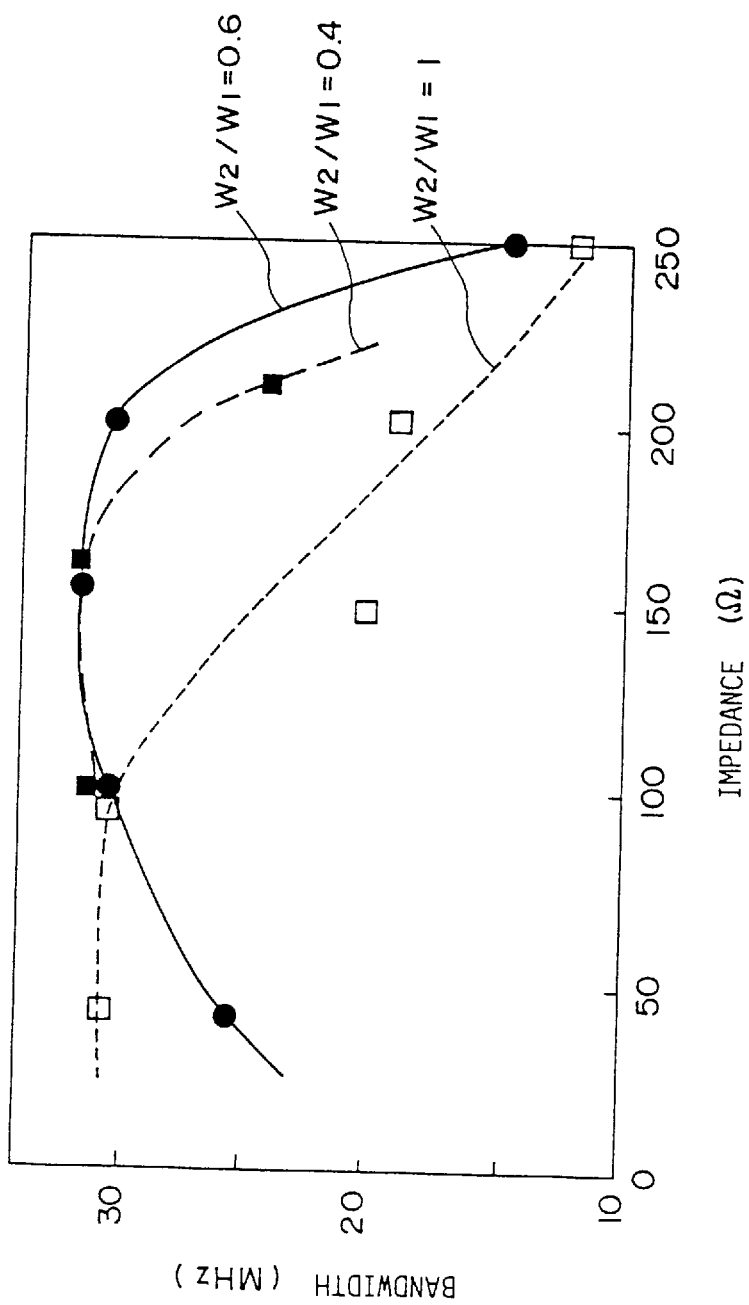
FIG. 19 is a diagram for explaining a relationship between the bandwidth and the impedance of the SAW device of FIG. 9.
Figure 20:
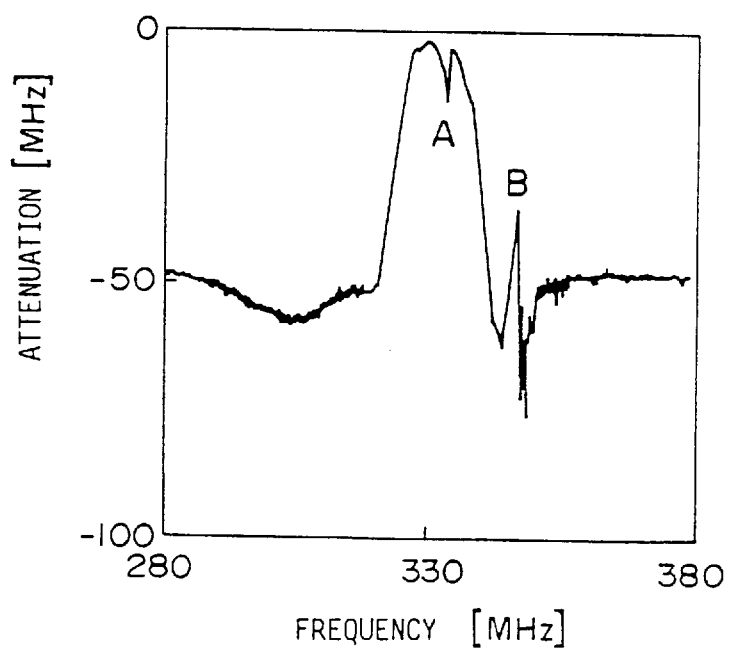
FIG. 20 is a graph for explaining band-pass characteristics of a conventional surface acoustic wave device.

FIG. 19 shows a relationship between the bandwidth and the output terminating impedance of the SAW device of FIG. 9. In FIG. 19, the input terminating impedance of the SAW device is fixed at 50Ω, and a change of the bandwidth of the SAW device when the output terminating impedance (RL) of the SAW device is varied in each of three cases: W2/W1=1, W2/W1=0.4 and W2/W1=0.6 is shown.

According to the characteristics of FIG. 19 in the case of W2/W1=1 (or the aperture lengths W1 and W2 are the same), it is found that when the output terminating impedance (RL) of the SAW device increases from about 100Ω, the bandwidth decreases from the level of about 30 MHz. According to the characteristics of FIG. 19 in the cases of W2/W1=0.4 and 0.6 (or the aperture lengths W1 and W2 are different), it is found that when the output terminating impedance (RL) of the SAW device is in a range between 75Ω and 200Ω, the bandwidth of the SAW device does not decrease and shows a good frequency characteristic.

Figure 10:
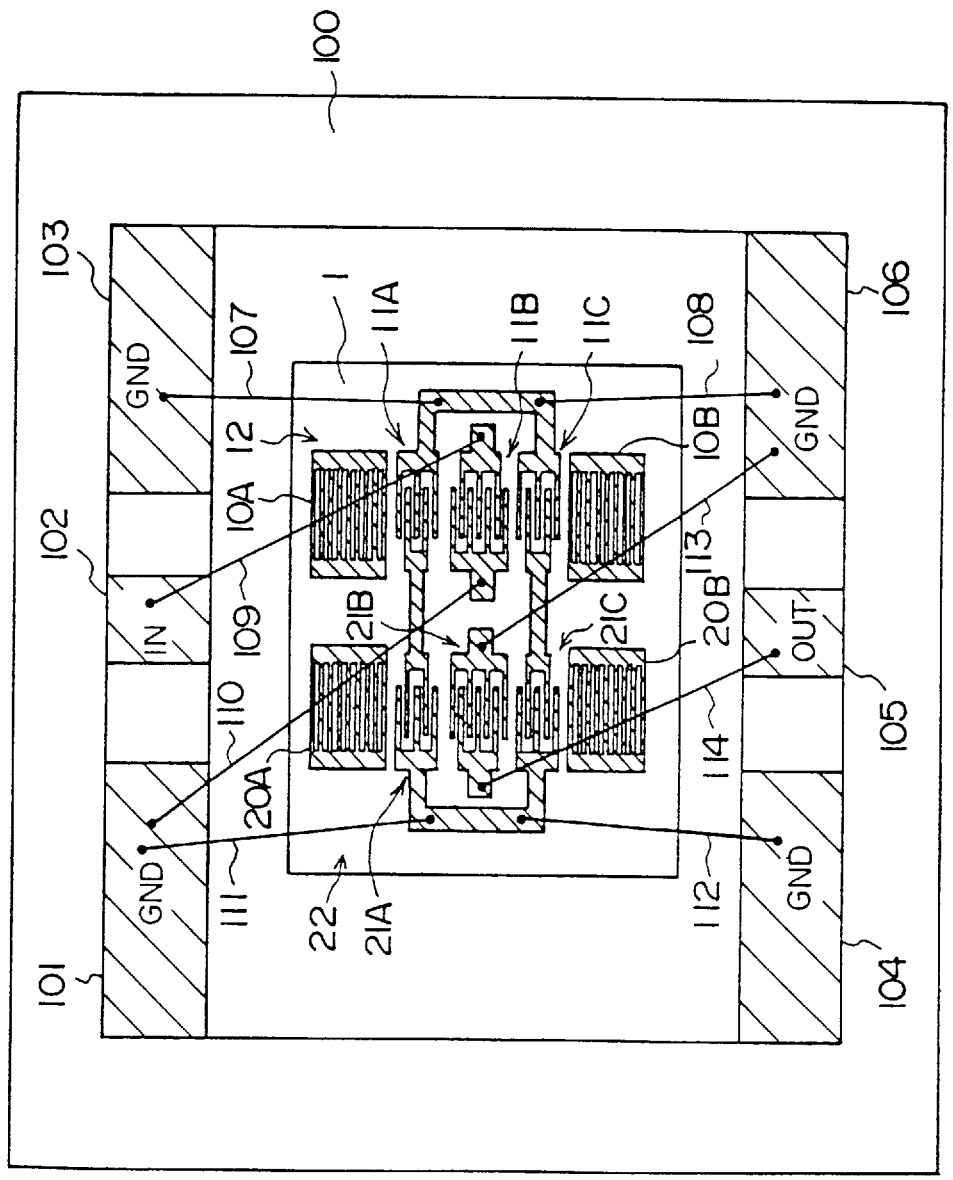
FIGS. 10 and 11 are diagrams showing comparative examples used to explain a third embodiment of the SAW device of the present invention.
Figure 11:
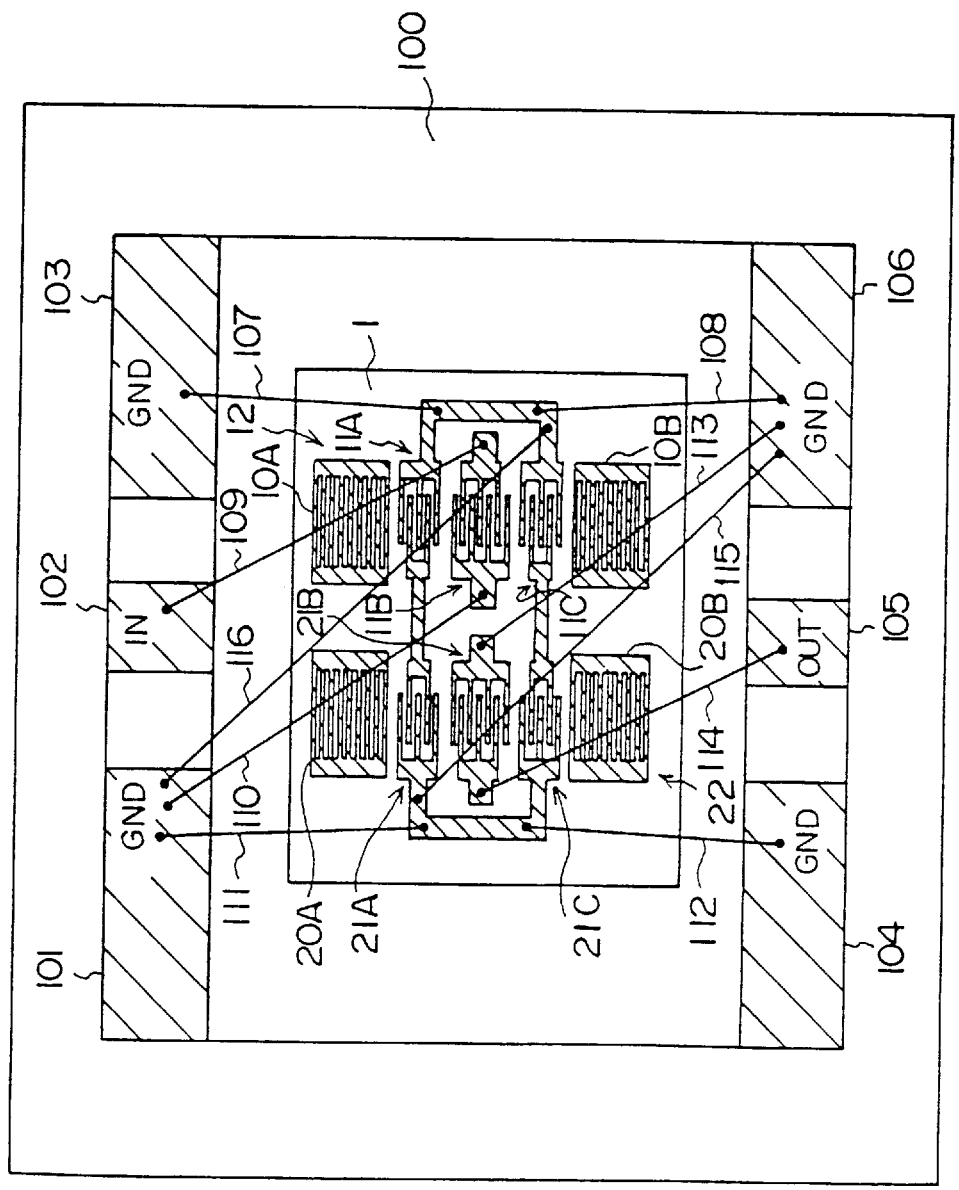
Figure 12:
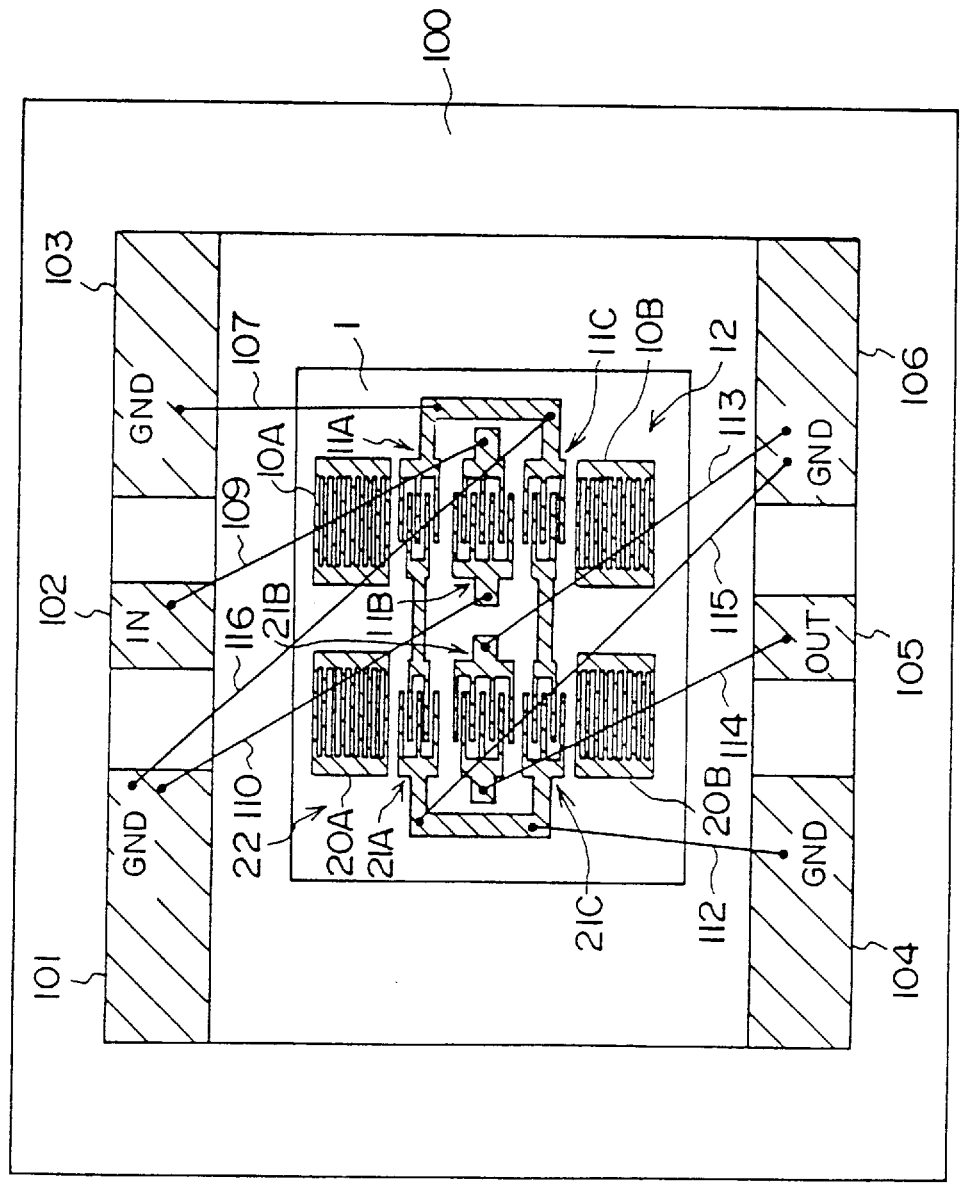
FIG. 12 is a diagram showing the third embodiment of the SAW device of the present invention.

FIGS. 10 and 11 show comparative examples for explaining a third embodiment of the SAW device of the present invention, and FIG. 12 shows the third embodiment of the SAW device of the present invention.

In each of FIGS. 10, 11 and 12, a surface acoustic wave (SAW) device which comprises a chip having the piezoelectric substrate (which is the same as the piezoelectric substrate of the SAW device of FIG. 9) and the SAW device (which is the same as the SAW device of FIG. 9) formed on the substrate, a package having signal pads and grounding pads and containing the chip, and a plurality of connecting wires, is illustrated.

In the comparative example of FIG. 10, a chip 1, a package 100 and a plurality of connecting wires are provided. In FIG. 10, the elements which are the same as corresponding elements of the SAW device of FIG. 9 are designated by the same reference numerals, and a description thereof will be omitted.

The chip 1 includes the piezoelectric substrate, and the reflectors and the interdigital transducers (IDT) formed on the piezoelectric substrate. This piezoelectric substrate is the same as the piezoelectric substrate of the SAW device of FIG. 9. That is, the piezoelectric substrate of this embodiment is made of a $LiTaO_3$ single crystal, the crystal having X, Y and Z axes, the X axis oriented in a direction of propagation of surface acoustic waves, the Y axis being oblique to a perpendicular line normal to a cut plane of the crystal, the cut plane being rotated around the X axis at a rotated angle from the Y axis to the Z axis, the rotated angle being in a range of 40° to 42°. By placing the reflectors and the electrodes on the cut plane of this substrate, the SAW device of this embodiment achieves a high level of the quality factor Q, and passes the desired frequencies of the order of some gigahertz with a small attenuation of the surface acoustic waves.

The reflectors and the interdigital transducers (IDT) formed on the substrate of the chip 1 are the same as the reflectors and the interdigital transducers (IDT) of the SAW device of FIG. 9. That is, the chip 1 includes the first SAW filter 12 and the second SAW filter 22 which are connected in a cascade connection. In the first SAW filter 12, the reflector 10A, the interdigital transducers 11A, 11B and 11C (which are called the front electrode 11A, the middle electrode 11B and the rear electrode 11C), and the reflector 10B are formed on the cut plane of the substrate and aligned, in this order, in a row in the direction of propagation of the surface acoustic waves. In the second SAW filter 22, the reflector 20A, the interdigital transducers 21A, 21B and 21C (which are called the front electrode 21A, the middle electrode 21B and the rear electrode 21C), and the reflector 20B are formed on the cut plane of the substrate and aligned, in this order, in another row in the direction of propagation of the surface acoustic waves.

The package 100 is made of a ceramic material. The package 100 includes an input terminal and an output terminal which are mutually opposed. As shown in FIG. 10, the package 100 contains the chip 1 which is interposed between the input terminal and the output terminal. In the input terminal, a pair of grounding pads 101 and 103, and an input signal pad 102 are formed, the input signal pad 102 being interposed between the grounding pads 101 and 103. In the output terminal, a pair of grounding pads 104 and 106, and an output signal pad 105 are formed, the output signal pad 105 being interposed between the grounding pads 104 and 106. The plurality of connecting wires are made of aluminum.

In the comparative example of FIG. 10, the grounding pad 103 of the input terminal and the primary electrode side (corresponding to the element $(11A)_1$ in FIG. 9) of the front electrode 11A are interconnected by a connecting wire 107. The grounding pad 106 of the output terminal and the primary electrode side (corresponding to the element $(11C)_1$ in FIG. 9) of the rear electrode 11C are interconnected by a connecting wire 108.

Further, the input signal pad 102 of the input terminal and the primary electrode side (corresponding to the element $(11B)_1$ in FIG. 9) of the middle electrode 11B are interconnected by a connecting wire 109. The grounding pad 101 of the input terminal and the secondary electrode side (corresponding to the element $(11B)_2$ in FIG. 9) of the middle electrode 11B are interconnected by a connecting wire 110.

In addition, the grounding pad 101 of the input terminal and the secondary electrode side (corresponding to the element $(21A)_2$ in FIG. 9) of the front electrode 21A are interconnected by a connecting wire 111. The grounding pad 104 of the output terminal and the secondary electrode side (corresponding to the element $(21C)_2$ in FIG. 9) of the rear electrode 21C are interconnected by a connecting wire 112.

Further, the output signal pad 105 of the output terminal and the secondary electrode side (corresponding to the element $(21B)_2$ in FIG. 9) of the middle electrode 21B are interconnected by a connecting wire 114. The grounding pad 106 of the output terminal and the primary electrode side (corresponding to the element $(21B)_1$ in FIG. 9) of the middle electrode 21B are interconnected by a connecting wire 113.

In addition, the secondary electrode side (corresponding to the element $(11A)_2$ in FIG. 9) of the front electrode 11A in the first SAW filter 12 is electrically connected to the primary electrode side (corresponding to the element $(21A)_1$ in FIG. 9) of the front electrode 21A in the second SAW filter 22, and the secondary electrode side (corresponding to the element $(11C)_2$ in FIG. 9) of the rear electrode 11C in the first SAW filter 12 are electrically connected to the primary electrode side (corresponding to the element $(21C)_1$ in FIG. 9) of the rear electrode 21C in the second SAW filter 22. That is, the first SAW filter 12 and the second SAW filter 22 are connected in a cascade connection.

In FIG. 11, the elements which are the same as corresponding elements in the comparative example of FIG. 10 are designated by the same reference numerals, and a description thereof will be omitted.

In the comparative example of FIG. 11, a connecting wire 115 and a connecting wire 116 are further provided in addition to the connecting wires 107 through 114 of FIG. 10. The grounding pad 106 of the output terminal and the secondary electrode side of the front electrode 21A are interconnected by the connecting wire 115. The grounding pad 101 of the input terminal and the primary electrode side of the rear electrode 11C are interconnected by the connecting wire 116.

The SAW device of FIG. 12 comprises the chip 1 having the first SAW filter 12 and the second SAW filter 22 on the piezoelectric substrate, and the package 100 having the input terminal and the output terminal, which are the same as corresponding elements of the comparative examples of FIGS. 10 and 11.

In the SAW device of FIG. 12, the grounding pad 103 of the input terminal and the primary electrode side (corresponding to the element $(11A)_1$ in FIG. 9) of the front electrode 11A are interconnected by the connecting wire 107. The input signal pad 102 of the input terminal and the primary electrode side (corresponding to the element $(11B)_1$ in FIG. 9) of the middle electrode 11B are interconnected by the connecting wire 109. The grounding pad 101 of the input terminal and the secondary electrode side (corresponding to the element $(11B)_2$ in FIG. 9) of the middle electrode 11B are interconnected by the connecting wire 110.

Further, the grounding pad 104 of the output terminal and the secondary electrode side (corresponding to the element $(21C)_2$ in FIG. 9) of the rear electrode 21C are interconnected by the connecting wire 112. The output signal pad 105 of the output terminal and the secondary electrode side (corresponding to the element $(21B)_2$ in FIG. 9) of the middle electrode 21B are interconnected by the connecting wire 114. The grounding pad 106 of the output terminal and the primary electrode side (corresponding to the element $(21B)_1$ in FIG. 9) of the middle electrode 21B are interconnected by the connecting wire 113.

Further, the grounding pad 106 of the output terminal and the secondary electrode side of the front electrode 21A are interconnected by the connecting wire 115. The grounding pad 101 of the input terminal and the primary electrode side of the rear electrode 11C are interconnected by the connecting wire 116.

Therefore, in the SAW device of FIG. 12, the connecting wire 108 and the connecting wire 111 which are included in the comparative example of FIG. 11 are eliminated, and other elements are the same as corresponding elements in the comparative example of FIG. 11.

In the SAW device of FIG. 12, all the connecting wires 107, 109, 110 and 116 which are connected to the first SAW filter 12 are connected to the pads of the input terminal only, and all the connecting wires 112, 113, 114 and 115 which are connected to the second SAW filter 22 are connected to the pads of the output terminal only. In the SAW device of FIG. 12, the first SAW filter 12 and the second SAW filter 22 are connected in a cascade connection in the same manner as in the comparative examples of FIGS. 10 and 11.

Figure 13:
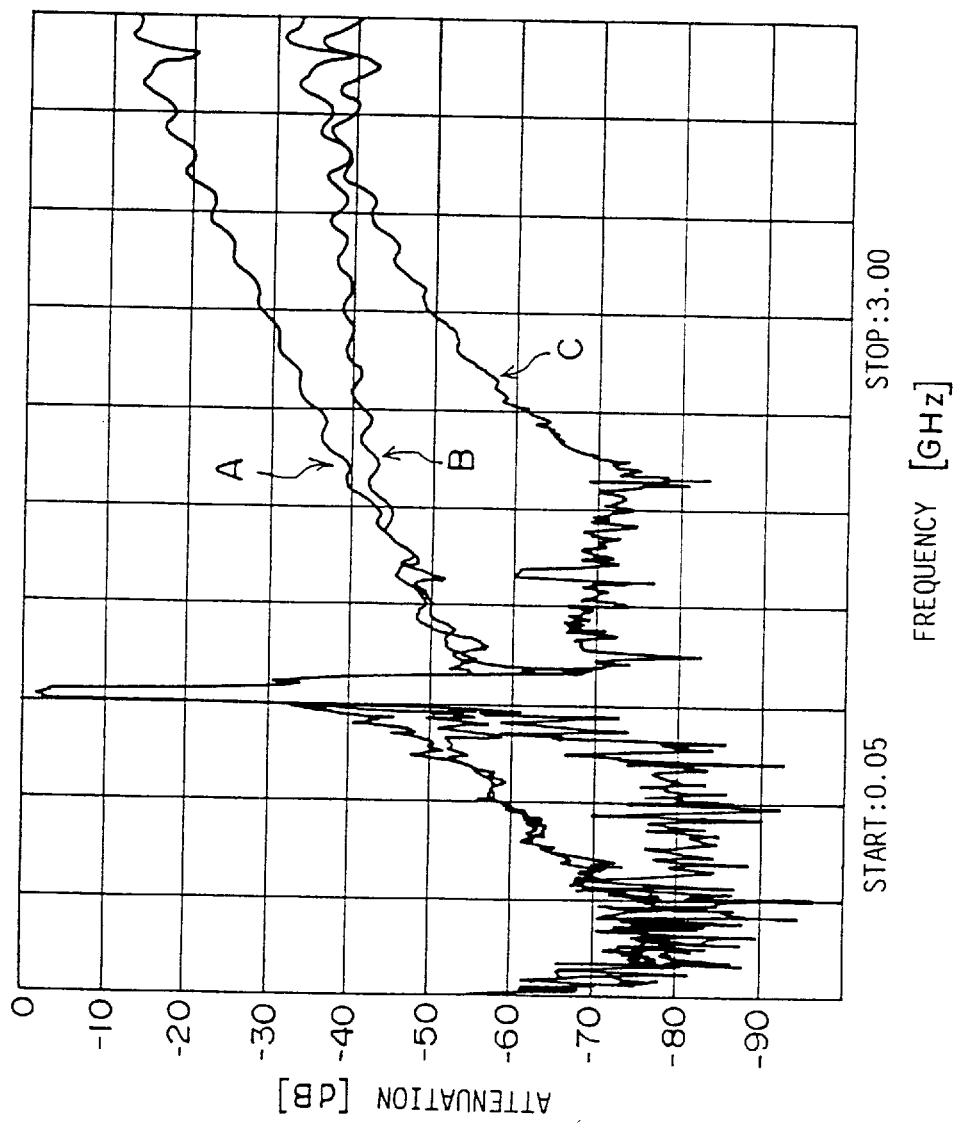
FIG. 13 is a graph for explaining band-pass characteristics of the SAW device of FIG. 12.

FIG. 13 is a graph for explaining band-pass characteristics of the SAW device of FIG. 12 by comparison with those of the comparative examples of FIGS. 10 and 11. In FIG. 13, "A" indicates a relationship between the attenuation and the frequency of the comparative example of FIG. 10, "B" indicates a relationship between the attenuation and the frequency of the comparative example of FIG. 11, and "C" indicates the relationship between the attenuation and the frequency of the SAW device of the present embodiment.

As shown in FIG. 13, the band-pass characteristics of the SAW device of the present embodiment, indicated by "C", are steeper than the band-pass characteristics of the comparative examples, indicated by "A" and "B". Therefore, it is found that the wire connections of the SAW device of FIG. 12 are more appropriate than the wire connections of the comparative examples of FIGS. 10 and 11 in order to provide the steepness of the band-pass characteristics for the practical SAW band-pass filter.

It is conceivable that the input side and the output side in the SAW device of the present embodiment are well balanced and the input signal and the output signal do not interfere with each other. This may be the reason why the SAW device of the present embodiment provides the steepness of the band-pass characteristics.

Figure 14:
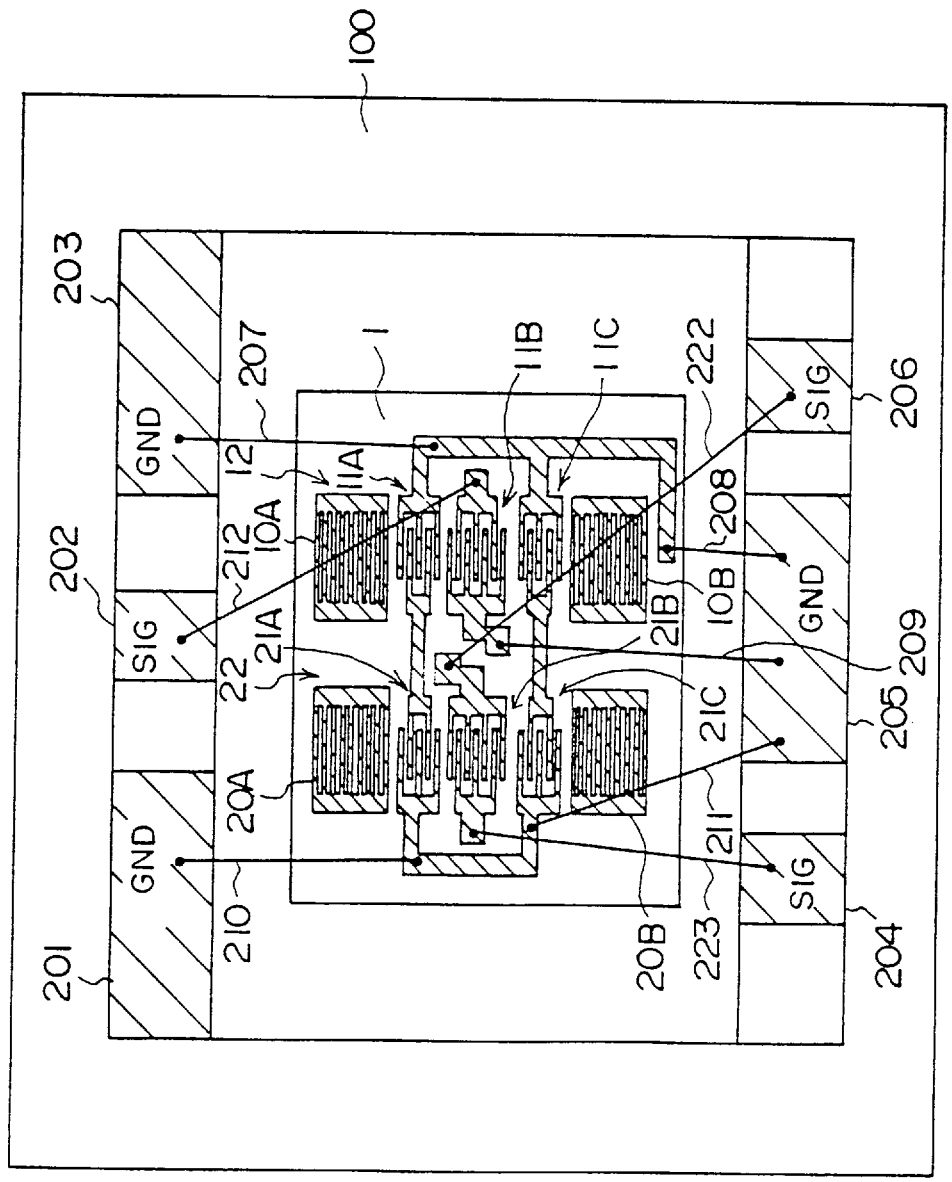
FIG. 14 is a diagram showing a fourth embodiment of the SAW device of the present invention.

FIG. 14 shows a fourth embodiment of the SAW device of the present invention. In FIG. 14, the elements which are the same as corresponding elements in FIG. 12 are designated by the same reference numerals, and a description thereof will be omitted.

The SAW device of FIG. 14 comprises a chip 1, a package 100 and a plurality of connecting wires.

The chip 1 includes the piezoelectric substrate, and the reflectors and the interdigital transducers (IDT) formed on the piezoelectric substrate. This piezoelectric substrate is the same as the piezoelectric substrate of the SAW device of FIG. 9.

The chip 1 includes a non-balance SAW filter 12 and a balance SAW filter 22 which are connected as shown in FIG. 14. In the non-balance SAW filter 12, the reflector 10A, the interdigital transducers 11A, 11B and 11C (which are called the front electrode 11A, the middle electrode 11B and the rear electrode 11C), and the reflector 10B are formed on the cut plane of the substrate and aligned, in this order, in a row in the direction of propagation of the surface acoustic waves. In the balance SAW filter 22, the reflector 20A, the interdigital transducers 21A, 21B and 21C (which are called the front electrode 21A, the middle electrode 21B and the rear electrode 21C), and the reflector 20B are formed on the cut plane of the substrate and aligned, in this order, in another row in the direction of propagation of the surface acoustic waves. Therefore, the reflectors and the interdigital transducers (IDT) formed on the substrate of the chip 1 are essentially the same as the reflectors and the interdigital transducers (IDT) of the SAW device of FIG. 9.

The package 100 is made of a ceramic material. The package 100 of the present embodiment includes a non-balance terminal and a balance terminal which are mutually opposed. As shown in FIG. 14, the package 100 contains the chip 1 which is interposed between the non-balance terminal and the balance terminal. In the non-balance terminal, a pair of grounding pads 201 and 203, and a signal pad 202 are formed, the signal pad 202 being interposed between the grounding pads 201 and 203. In the balance terminal, a pair of signal pads 204 and 206, and a grounding pad 205 are formed, the grounding pad 205 being interposed between the signal pads 204 and 206. The plurality of connecting wires are made of aluminum.

In the SAW device of FIG. 14, the grounding pad 203 of the non-balance terminal and the primary electrode side (corresponding to the element $(11A)_1$ in FIG. 9) of the front electrode 11A are interconnected by a connecting wire 207. The grounding pad 205 of the balance terminal and the primary electrode side (corresponding to the element $(11C)_1$ in FIG. 9) of the rear electrode 11C are interconnected by a connecting wire 208.

Further, the signal pad 202 of the non-balance terminal and the primary electrode side (corresponding to the element $(11B)_1$ in FIG. 9) of the middle electrode 11B are interconnected by a connecting wire 212. The grounding pad 205 of the balance terminal and the secondary electrode side (corresponding to the element $(11B)_2$ in FIG. 9) of the middle electrode 11B are interconnected by a connecting wire 209.

In addition, the grounding pad 201 of the non-balance terminal and the secondary electrode side (corresponding to the element $(21A)_2$ in FIG. 9) of the front electrode 21A are interconnected by a connecting wire 210. The grounding pad 205 of the balance terminal and the secondary electrode side (corresponding to the element $(21C)_2$ in FIG. 9) of the rear electrode 21C are interconnected by a connecting wire 211.

Further, the signal pad 206 of the balance terminal and the primary electrode side (corresponding to the element $(21B)_1$ in FIG. 9) of the middle electrode 21B are interconnected by a connecting wire 222. The signal pad 204 of the balance terminal and the secondary electrode side (corresponding to the element $(21B)_2$ in FIG. 9) of the middle electrode 21B are interconnected by a connecting wire 223.

In addition, the secondary electrode side (corresponding to the element $(11A)_2$ in FIG. 9) of the front electrode 11A is electrically connected to the primary electrode side (corresponding to the element $(21A)_1$ in FIG. 9) of the front electrode 21A, and the secondary electrode side (corresponding to the element $(11C)_2$ in FIG. 9) of the rear electrode 11C is electrically connected to the primary electrode side (corresponding to the element $(21C)_1$ in FIG. 9) of the rear electrode 21C. That is, the non-balance SAW filter 12 and the balance SAW filter 22 are connected in a cascade connection.

An important feature of the SAW device of FIG. 14 is that the connecting wire 211 interconnects the secondary electrode side (corresponding to the element $(21C)_2$ in FIG. 9) of the rear electrode 21C and the grounding pad 205 of the balance terminal.

Figure 15:
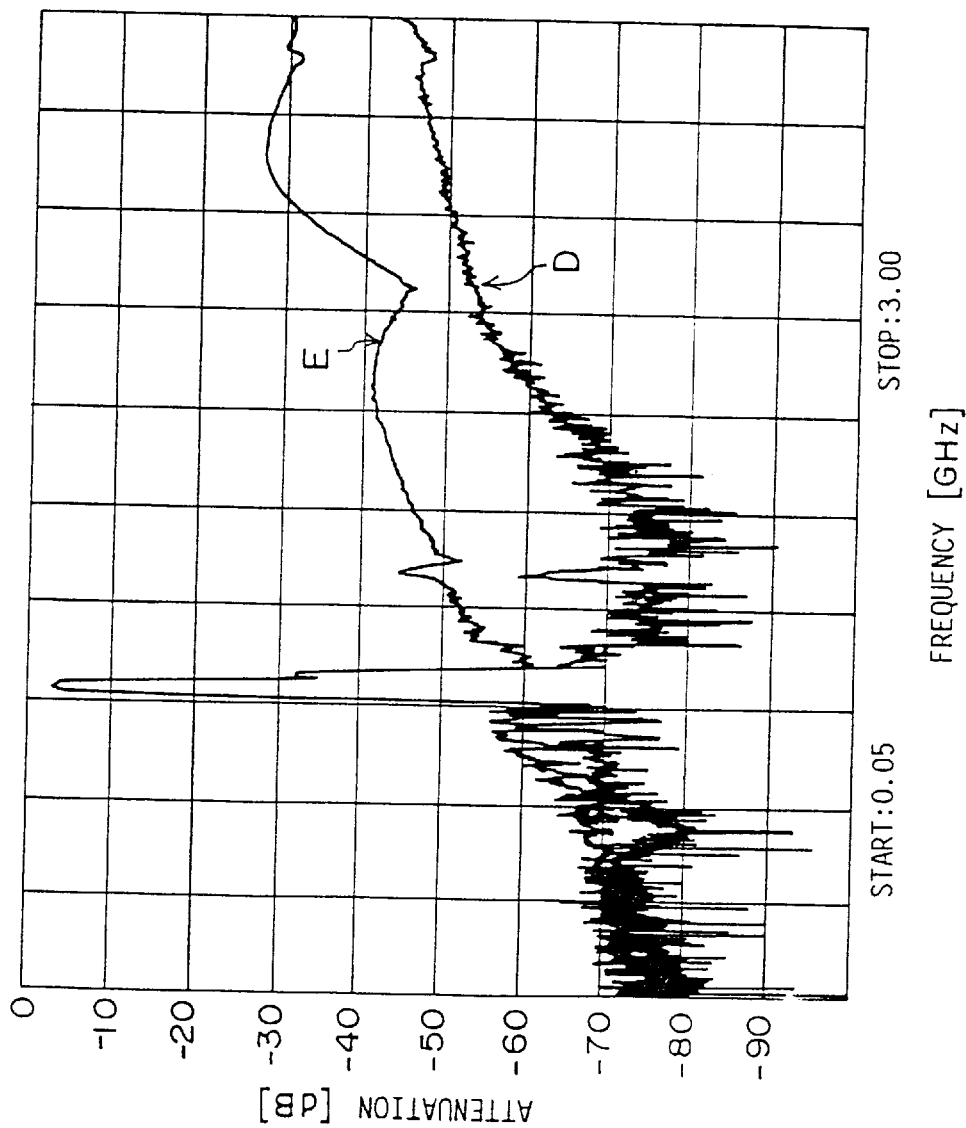
FIG. 15 is a graph for explaining band-pass characteristics of the SAW device of FIG. 14.

FIG. 15 is a graph for explaining band-pass characteristics of the SAW device of FIG. 14 by comparison with those of a comparative example in which the connecting wire 211 is not provided and the other elements are the same as corresponding elements in the SAW device of FIG. 14. In FIG. 15, "E" indicates a relationship between the attenuation and the frequency of the comparative example, and "D" indicates the relationship between the attenuation and the frequency of the SAW device of the present embodiment in which the connecting wire 211 is provided.

As shown in FIG. 15, the band-pass characteristics of the SAW device of the present embodiment, indicated by "D", are steeper than the band-pass characteristics of the comparative example, indicated by "E". Therefore, it is conceivable that the wire connections of the SAW device of FIG. 14 are more appropriate than the wire connections of the comparative example in order to provide the steepness of the band-pass characteristics for the practical SAW band-pass filter.

Figure 16:
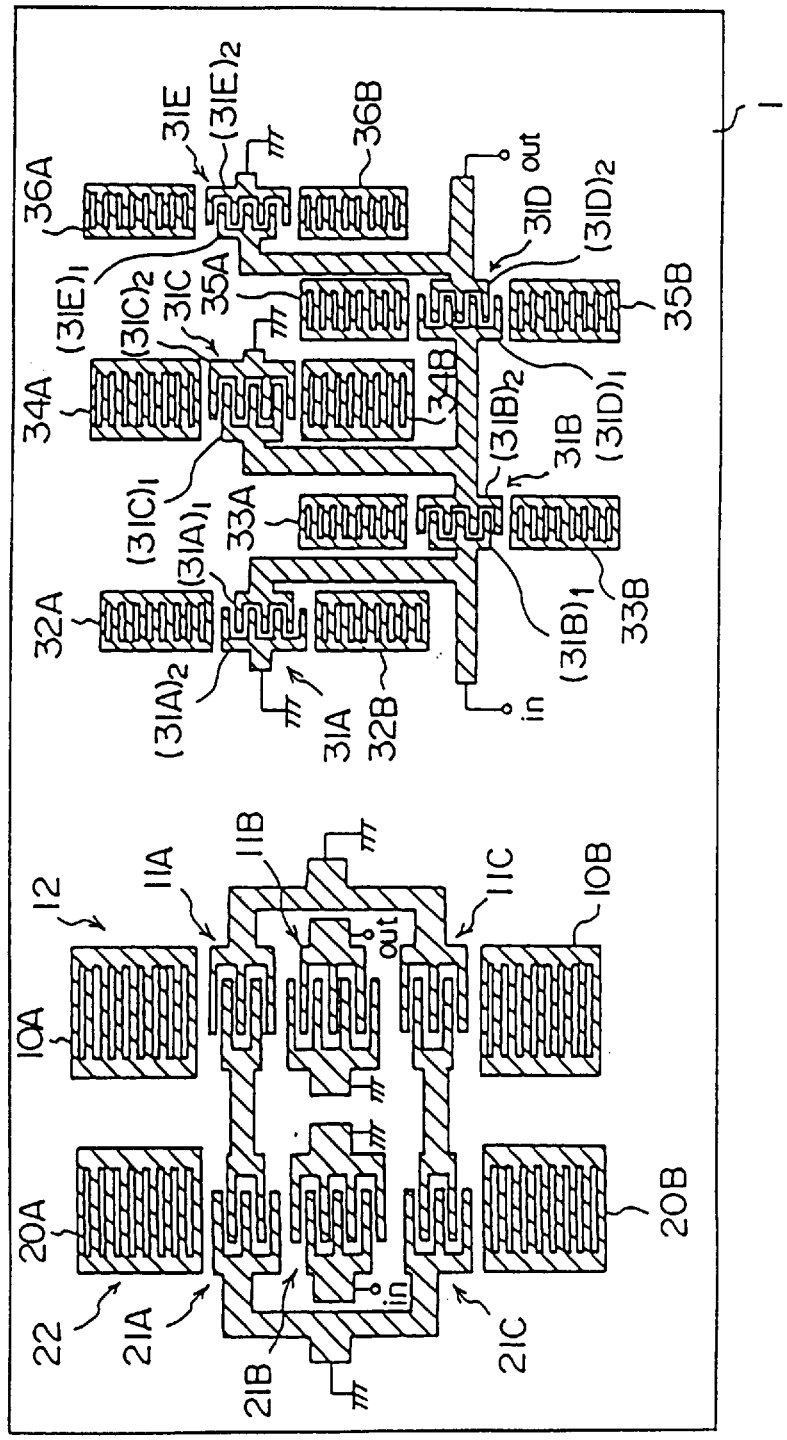
FIG. 16 is a diagram showing a fifth embodiment of the SAW device of the present invention.

FIG. 16 shows a fifth embodiment of the SAW device of the present invention.

In the SAW device of FIG. 16, a multiple-mode SAW band-pass filter (which is called the multiple-mode filter) and a ladder SAW band-pass filter (which is called the ladder filter) are formed on the piezoelectric substrate (not shown) of the chip 1 in common. The multiple-mode filter and the ladder filter in the SAW device of this embodiment have different passband frequencies. That is, the SAW device of FIG. 16 is formed as a dual-band SAW filter on the chip 1.

The multiple-mode filter of FIG. 16 is the same as the SAW device of FIG. 9, which comprises the first SAW filter 12 and the second SAW filter 22 which are connected in a cascade connection. The multiple-mode filter serves to pass the desired frequencies in the lower passband of 800 MHz to 900 MHz. In FIG. 16, the elements which are the same as corresponding elements in the SAW device of FIG. 9 are designated by the same reference numerals, and a description thereof will be omitted.

The ladder filter of FIG. 16 comprises a plurality of SAW resonators which are connected in a ladder connection, which will be described later. The ladder filter serves to pass the desired frequencies in the higher passband of 1.7 GHz to 1.9 GHz.

Similarly to the embodiment of FIG. 9, in the SAW device of FIG. 16, reflectors and interdigital transducers (IDT) are formed on the piezoelectric substrate (not shown) which is the same as the piezoelectric substrate of the SAW device of FIG. 1A. The piezoelectric substrate of this embodiment is made of a LiTaO$_3$ single crystal, the crystal having X, Y and Z axes, the X axis oriented in a direction of propagation of surface acoustic waves, the Y axis being oblique to a perpendicular line normal to a cut plane of the crystal, the cut plane being rotated around the X axis at a rotated angle from the Y axis to the Z axis, the rotated angle being in a range of 40° to 42°. By placing the reflectors and the electrodes on the cut plane of this substrate, the SAW device of this embodiment achieves a high level of the quality factor Q, and passes the desired frequencies of the order of some gigahertz with a small attenuation of the surface acoustic waves.

In the multiple-mode filter of the SAW device of FIG. 16, the first SAW filter 12 comprises the front reflector 10A, the front electrode 11A, the middle electrode 11B, the rear electrode 11C, and the rear reflector 10B, which are formed on the substrate of the chip 1 and aligned, in this order, in a row in the direction of propagation of the surface acoustic waves. The second SAW filter 22 comprises the front reflector 20A, the front electrode 21A, the middle electrode 21B, the rear electrode 21C, and the rear reflector 20B, which are formed on the substrate of the chip 1 and aligned, in this order, in another row in the direction of propagation of the surface acoustic waves. Other elements are essentially the same as corresponding elements in FIG. 9.

The ladder filter of the SAW device of FIG. 16 comprises interdigital transducers (IDT) 31A, 31B, 31C, 31D and 31E (which are called the electrodes), and pairs of reflectors 32A, 32B, 33A, 33B, 34A, 34B, 35A, 35B, 36A and 36B. These electrodes and reflectors are formed on the substrate of the chip 1. In the ladder filter, the SAW resonators, each of which is formed with an electrode between two reflectors and aligned in a row in the direction of propagation of the surface acoustic waves, are connected in a ladder connection as shown in FIG. 16.

In the ladder filter of FIG. 16, an input terminal "in" is connected to a primary electrode side $(31A)_1$ of the electrode 31A and a primary electrode side $(31B)_1$ of the electrode 31B in common. A secondary electrode side $(31A)_2$ of the electrode 31A is grounded. A secondary electrode side $(31B)_2$ of the electrode 31B is connected to a primary electrode side $(31C)_1$ of the electrode 31C and a primary electrode side $(31D)_1$ of the electrode 31D in common.

A secondary electrode side $(31C)_2$ of the electrode 31C is grounded. A secondary electrode side $(31D)_2$ of the electrode 31D is connected to a primary electrode side $(31E)_1$ of the electrode 31E and an output terminal "out". A secondary electrode side $(31E)_2$ of the electrode 31E is grounded.

In the ladder filter of FIG. 16, the electrode 31A is interposed between the reflectors 32A and 32B, the electrode 31B is interposed between the reflectors 33A and 33B, the electrode 31C is interposed between the reflectors 34A and 34B, the electrode 31D is interposed between the reflectors 35A and 35B, and the electrode 31E is interposed between the reflectors 36A and 36B. That is, each of the five SAW resonators is aligned in a row in the direction of propagation of the surface acoustic waves as shown in FIG. 16.

The electrodes in the multiple-mode filter can be easily formed on the piezoelectric substrate with a small thickness. Even if the thickness of the electrodes in the multiple-mode filter is reduced to a certain extent, the passband ripple in the passband characteristic of the multiple-mode filter does not take place. However, the electrodes in the ladder filter are not easily formed on the piezoelectric substrate with a small thickness. If the thickness of the electrodes in the ladder filter is reduced to a thickness smaller than 10% of the wavelength ("lambda") of the surface acoustic waves, the passband ripple in the passband characteristic of the ladder filter appears and the passband characteristic is degraded. Therefore, it is difficult for the thickness of the electrodes in the ladder filter to be reduced while the ladder filter provides a good passband characteristic.

In recent wireless communication systems such as handy telephones, there is the demand for a dual-band SAW filter which can be used in common to pass the desired frequencies in the lower passband of 800 MHz–900 MHz and to pass the desired frequencies in the higher passband of 1.7 GHz–1.9 GHz.

According to the SAW device of the present embodiment, it is possible to provide a dual-band SAW filter with low cost. In the SAW device of the present embodiment, the thickness of the electrodes in the multiple-mode filter and the thickness of the electrodes in the ladder filter can be made the same and small. The production of the SAW device of the present embodiment can be efficiently carried out and the cost is remarkably reduced.

It is very difficult to carry out the production of a dual-band SAW filter in which the thickness of the electrodes in the multiple-mode filter and the thickness of the electrodes in the ladder filter are different from each other. The efficiency of the production is low and the cost is high.

Figure 18:
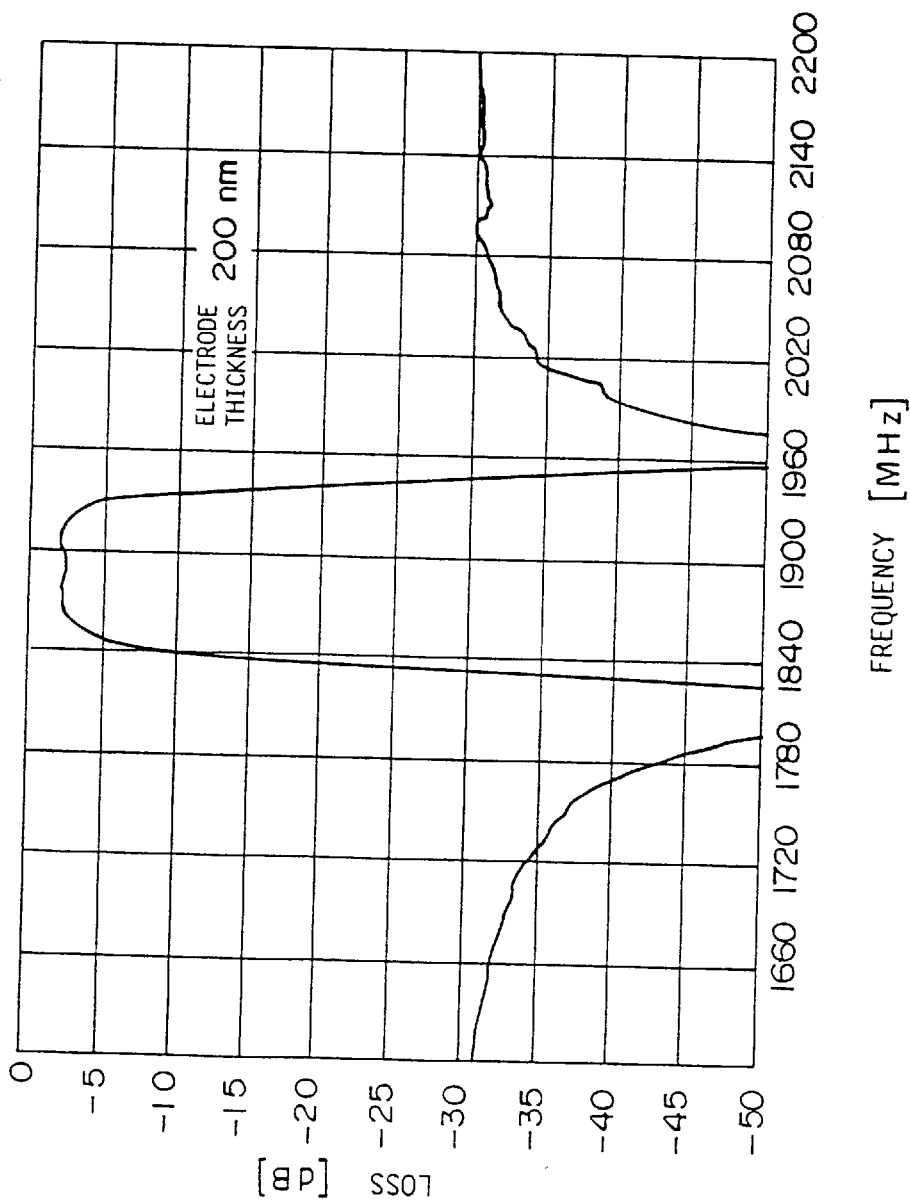
FIG. 18 is a diagram for explaining a relationship between the loss and the frequency of a ladder filter of the SAW device of FIG. 16.

FIG. 18 shows a relationship between the loss and the frequency of the ladder filter of the SAW device of FIG. 16. The ladder filter has a center frequency of 1.9 GHz in the passband frequencies. The thickness of the electrodes (aluminum) in the ladder filter is set at 200 nm (nanometers).

As shown in FIG. 18, it is found that the ladder filter shows a good passband characteristic, and the passband ripple does not take place.

Figure 17:
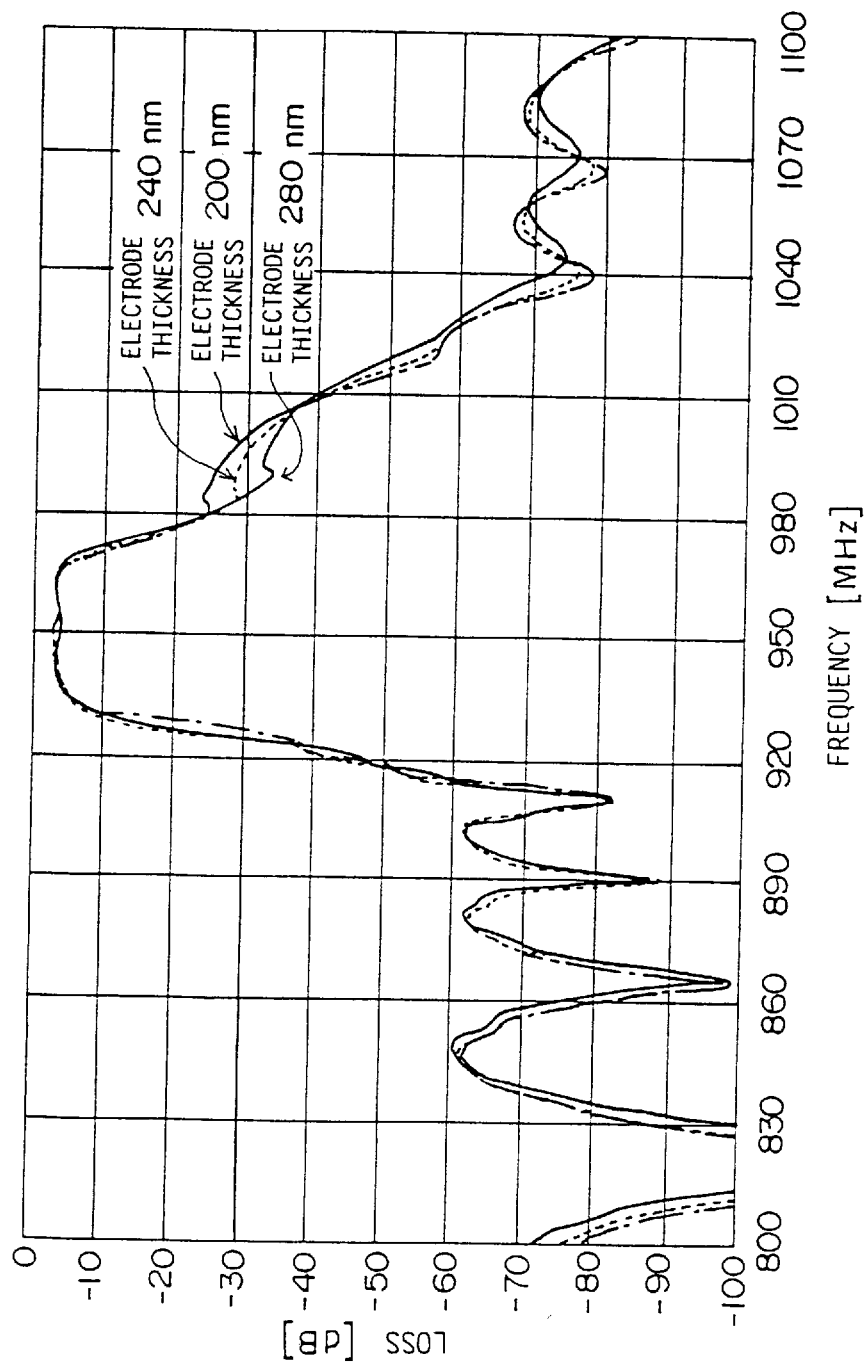
FIG. 17 is a diagram for explaining a relationship between the loss and the frequency of a multiple-mode filter of the SAW device of FIG. 16.

FIG. 17 shows a relationship between the loss and the frequency of the multiple-mode filter of the SAW device of FIG. 16. In FIG. 17, a change of the loss of the multiple-mode filter when the frequency is varied in each of three cases in which the thickness of the electrodes is set at 200 nm, 240 nm and 280 nm is shown.

As shown in FIG. 17, it is found that the passband characteristic of the multiple-mode filter is slightly changed if the thickness of the electrodes is varied, but the multiple-mode filter shows a good passband characteristic even if the thickness of the electrodes in the multiple-mode filter is set at 200 nm which is the same as the thickness of the electrodes in the case of the ladder filter shown in FIG. 18.

According to the results of FIGS. 17 and 18, it is possible that the SAW device of the present embodiment be used as a dual-band SAW filter which passes the desired frequencies in the lower passband of 800 MHz–900 MHz and passes the desired frequencies in the higher passband of 1.7 GHz–2.0 GHz. In the SAW device of the present embodiment, the thickness of the electrodes in the multiple-mode filter and the thickness of the electrodes in the ladder filter can be made the same, and the passband characteristic in each of the lower passband and the higher passband is not degraded. Therefore, the production of the SAW device of the present embodiment can be efficiently carried out and the cost is remarkably reduced.

Further, the present invention is not limited to the above-described embodiments, and variations and modifications may be made without departing from the present invention.

What is claimed is:

1. A multiple-mode surface acoustic wave device comprising:

a piezoelectric substrate of a LiTaO$_3$ single crystal, the crystal having X, Y and Z axes and a cut plane, the X axis oriented in a direction of propagation of surface acoustic waves, the cut plane being rotated around the X axis at a rotated angle from the Y axis to the Z axis, the rotated angle being in a range between 40° and 42°;

a pair of reflectors formed on the cut plane of the substrate and aligned in a row in the direction of propagation; and interdigital transducers formed on the cut plane of the substrate and aligned in the row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer which are aligned in the row in the direction of propagation, wherein a ratio of the number of pairs of the primary and the secondary electrode fingers in one of the front transducer and the rear transducer to the number of pairs of the primary and the secondary electrode fingers in the middle transducer is in a range between 55% and 80%.

2. The device according to claim 1, wherein an electrode-to-electrode pitch between a centerline of a rear-end electrode finger of the front transducer and a centerline of a front-end electrode finger of the middle transducer in the direction of propagation is in a range between 0.75 and 0.90 when the electrode-to-electrode pitch is represented by a fractional multiple of a wavelength of the surface acoustic waves.

3. The device according to claim 1, wherein an electrode-to-electrode pitch between a centerline of a rear-end electrode finger of the front transducer and a centerline of a front-end electrode finger of the middle transducer in the direction of propagation is in a range between 0.78 and 0.85 when the electrode-to-electrode pitch is represented by a fractional multiple of a wavelength of the surface acoustic waves.

4. The device according to claim 1, wherein an interval ratio of a distance between two electrode fingers of one of the primary electrode fingers and the secondary electrode fingers in the interdigital transducers in the direction of propagation to a distance between two of gratings in the reflectors in the direction of propagation is in a range between 0.977 and 0.992.

5. The device according to claim 1, wherein an aperture length between an edge of one of the primary electrode fingers and an edge of one of the secondary electrode fingers in each of the interdigital transducers in a lateral direction perpendicular to the direction of propagation is in a range between 40 and 70 when the aperture length is represented by a multiple of a wavelength of the surface acoustic waves.

6. A multiple-mode surface acoustic wave device comprising:

a piezoelectric substrate of a LiTaO$_3$ single crystal, the crystal having X, Y and Z axes and a cut plane, the X axis oriented in a direction of propagation of surface acoustic waves, the cut plane being rotated around the X axis at a rotated angle from the Y axis to the Z axis, the rotated angle being in a range between 40° and 42°;

a pair of reflectors formed on the cut plane of the substrate and aligned in a row in the direction of propagation; and interdigital transducers formed on the cut plane of the substrate and aligned in the row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer which are aligned in the row in the direction of propagation, wherein a ratio of the number of pairs of the primary and the secondary electrode fingers in one of the front transducer and the rear transducer to the number of pairs of the primary and the secondary electrode fingers in the middle transducer is set in a range between 65% and 75%.

7. The device according to claim 6, wherein an electrode-to-electrode pitch between a centerline of a rear-end electrode finger of the front transducer and a centerline of a front-end electrode finger of the middle transducer in the direction of propagation is in a range between 0.75 and 0.90 when the electrode-to-electrode pitch is represented by a fractional multiple of a wavelength of the surface acoustic waves.

8. The device according to claim 6, wherein an electrode-to-electrode pitch between a centerline of a rear-end electrode finger of the front transducer and a centerline of a front-end electrode finger of the middle transducer in the direction of propagation is in a range between 0.78 and 0.85 when the electrode-to-electrode pitch is represented by a fractional multiple of a wavelength of the surface acoustic waves.

9. The device according to claim 6, wherein an interval ratio of a distance between two electrode fingers of one of the primary electrode fingers and the secondary electrode fingers in the interdigital transducers in the direction of propagation to a distance between two of gratings in the reflectors in the direction of propagation is in a range between 0.977 and 0.992.

10. The device according to claim 6, wherein an aperture length between an edge of one of the primary electrode fingers and an edge of one of the secondary electrode fingers in each of the interdigital transducers in a lateral direction perpendicular to the direction of propagation is in a range between 40 and 70 when the aperture length is represented by a multiple of a wavelength of the surface acoustic waves.

11. A multiple-mode surface acoustic wave device comprising:
   a piezoelectric substrate of a LiTaO$_3$ single crystal, the crystal having X, Y and Z axes and a cut plane, the X axis oriented in a direction of propagation of surface acoustic waves, the cut plane being rotated around the X axis at a rotated angle from the Y axis to the Z axis, the rotated angle being in a range between 40° and 42°; and
   first and second surface acoustic wave filters connected in a cascade connection and formed on the cut plane of the substrate,
   each of the first and second surface acoustic wave filters comprising:
      a pair of reflectors aligned in a row in the direction of propagation; and
      interdigital transducers aligned in the row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer which are aligned in the row in the direction of propagation,
      wherein a ratio of the number of pairs of the primary and the secondary electrode fingers in one of the front transducer and the rear transducer to the number of pairs of the primary and the secondary electrode fingers in the middle transducer for each of the first and the second surface acoustic wave filters is in a range between 55% and 80%,
      wherein an electrode-to-electrode pitch between a centerline of a rear-end electrode finger of the front transducer and a centerline of a front-end electrode finger of the middle transducer in the direction of propagation for each of the first and the second surface acoustic wave filters is in a range between 0.75 and 0.90 when the electrode-to-electrode pitch is represented by a fractional multiple of a wavelength of the surface acoustic waves,
      wherein an interval ratio of a distance between two electrode fingers of one of the primary electrode fingers and the secondary electrode fingers in the direction of propagation to a distance between two of gratings in the reflectors in the direction of propagation for each of the first and the second surface acoustic wave filters is in a range between 0.977 and 0.992,
      wherein an aperture length between an edge of one of the primary electrode fingers and an edge of one of the secondary electrode fingers in each of the interdigital transducers in a lateral direction perpendicular to the direction of propagation for the first surface acoustic wave filter is different from an aperture length for the second surface acoustic wave filter.

12. The device according to claim 11, wherein the first surface acoustic wave filter and the second surface acoustic wave filter have an input terminating impedance and an output terminating impedance which are different from each other, and wherein the aperture length for the first surface acoustic wave filter as a multiple of the wavelength of the surface acoustic waves is in a range between 40 and 60 exclusive of 60, and the aperture length for the second surface acoustic wave filter as a multiple of the wavelength of the surface acoustic waves is in a range between 20 and 60 exclusive of 60.

13. A surface acoustic wave device comprising:
   a piezoelectric substrate of a LiTaO$_3$ single crystal, the crystal having X, Y and Z axes and a cut plane, the X axis oriented in a direction of propagation of surface acoustic waves, the cut plane being rotated around the X axis at a rotated angle from the Y axis to the Z axis, the rotated angle being in a range between 40° and 42°; and
   first and second surface acoustic wave filters connected in a cascade connection and formed on the cut plane of the substrate,
   each of the first and second surface acoustic wave filters comprising:
      a pair of reflectors aligned in a row in the direction of propagation; and
      interdigital transducers aligned in the row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer which are aligned in the row in the direction of propagation,
      wherein a ratio of the number of pairs of the primary and the secondary electrode fingers in one of the front transducer and the rear transducer to the number of pairs of the primary and the secondary electrode fingers in the middle transducer for each of the first and the second surface acoustic wave filters is in a range between 65% and 75%,
      wherein an electrode-to-electrode pitch between a centerline of a rear-end electrode finger of the front transducer and a centerline of a front-end electrode finger of the middle transducer in the direction of propagation for each of the first and the second surface acoustic wave filters is in a range between 0.75 and 0.90 when the electrode-to-electrode pitch is represented by a fractional multiple of a wavelength of the surface acoustic waves,
      wherein an interval ratio of a distance between two electrode fingers of one of the primary electrode fingers and the secondary electrode fingers in the direction of propagation to a distance between two of gratings in the reflectors in the direction of propagation for each of the first and the second surface acoustic wave filters is in a range between 0.977 and 0.992,
      wherein an aperture length between an edge of one of the primary electrode fingers and an edge of one of the secondary electrode fingers in each of the interdigital transducers in a lateral direction perpendicular to the direction of propagation for the first surface acoustic wave filter is different from an aperture length for the second surface acoustic wave filter.

14. The device according to claim 13, wherein the first surface acoustic wave filter and the second surface acoustic wave filter have an input terminating impedance and an output terminating impedance which are different from each other, and wherein the aperture length for the first surface acoustic wave filter as a multiple of the wavelength of the surface acoustic waves is in a range between 40 and 60 exclusive of 60, and the aperture length for the second surface acoustic wave filter as a multiple of the wavelength of the surface acoustic waves is in a range between 20 and 60 exclusive of 60.

15. The device according to claim 13, further comprising:
a chip in which the first and the second surface acoustic wave filters are formed on the piezoelectric substrate;
a package of a ceramic material, the package having an input terminal and an output terminal which are mutually opposed, the package containing the chip interposed between the input terminal and the output terminal, the input terminal having a signal pad and grounding pads, the output terminal having a signal pad and grounding pads; and
connecting wires for interconnecting the chip and the package, the connecting wires having input connecting wires and output connecting wires,
wherein the interdigital transducers of the first acoustic wave filter and the signal pad and the grounding pads of the input terminal are interconnected by the input connecting wires, and the interdigital transducers of the second acoustic wave filter and the signal pad and the grounding pads of the output terminal are interconnected by the output connecting wires.

16. The device according to claim 13, further comprising:
a chip in which the first and the second surface acoustic wave filters are formed on the piezoelectric substrate;
a package of a ceramic material, the package having a non-balance terminal and a balance terminal which are mutually opposed, the package containing the chip interposed between the non-balance terminal and the balance terminal, the non-balance terminal having a signal pad and grounding pads, the balance terminal having signal pads and a grounding pad; and
connecting wires for interconnecting the chip and the package,
wherein the middle transducer of the first acoustic wave filter and the signal pad of the non-balance terminal are interconnected by the connecting wires,
wherein the middle transducer of the first acoustic wave filter and the grounding pad of the balance terminal are interconnected by the connecting wires,
wherein the front and the rear transducers of the first acoustic wave filter and one of the grounding pads of the non-balance terminal are interconnected by the connecting wires, and the front and the rear transducers of the second acoustic wave filter and the other of the grounding pads of the non-balance terminal are interconnected by the connecting wires,
wherein the middle transducer of the second acoustic wave filter and the signal pads of the balance terminal are interconnected by the connecting wires,
wherein the front and the rear transducers of the first acoustic wave filter and the grounding pad of the balance terminal are interconnected by the connecting wires, and the front and the rear transducers of the second acoustic wave filter and the grounding pad of the balance terminal are interconnected by the connecting wires.

17. A multiple-mode surface acoustic wave device comprising:
a piezoelectric substrate of a $LiTaO_3$ single crystal, the crystal having X, Y and Z axes and a cut plane, the X axis oriented in a direction of propagation of surface acoustic waves, the cut plane being rotated around the X axis at a rotated angle from the Y axis to the Z axis, the rotated angle being in a range between 40° and 42°;
first and second surface acoustic wave filters connected to each other and formed on the cut plane of the substrate; and
a ladder filter formed on the cut plane of the substrate and provided in parallel to the first and the second surface acoustic wave filters, the ladder filter having surface acoustic wave resonators connected in a ladder connection, each resonator having a pair of reflectors and an interdigital transducer which are aligned in a row in the direction of propagation, the transducer interposed between the reflectors,
each of the first and second surface acoustic wave filters comprising:
a pair of reflectors aligned in a row in the direction of propagation; and
interdigital transducers aligned in the row in the direction of propagation, the interdigital transducers interposed between the reflectors, each interdigital transducer having pairs of mutually opposed primary electrode fingers and secondary electrode fingers, the interdigital transducers including at least a front transducer, a middle transducer and a rear transducer which are aligned in the row in the direction of propagation,
wherein a ratio of the number of pairs of the primary and the secondary electrode fingers in one of the front transducer and the rear transducer to the number of pairs of the primary and the secondary electrode fingers in the middle transducer for each of the first and the second surface acoustic wave filters is in a range between 55% and 80%,
wherein the first and the second surface acoustic wave filters have passband frequencies, and the ladder filter has passband frequencies which are higher than the passband frequencies of the first and the second surface acoustic wave filters.

18. The device according to claim 17, wherein the first surface acoustic wave filter and the second surface acoustic wave filter are connected in a cascade connection and have an input terminating impedance and an output terminating impedance which are different from each other.

19. The device according to claim 17, wherein the passband frequencies of the first and the second surface acoustic wave filters are in a range between 800 MHz and 900 MHz, and the passband frequencies of the ladder filter are in a range between 1.7 GHz and 2.0 GHz.

* * * * *